United States Patent
He et al.

(10) Patent No.: US 12,204,386 B2
(45) Date of Patent: Jan. 21, 2025

(54) METHOD AND APPARATUS FOR A SILENT BLOWER IN AN INFORMATION HANDLING SYSTEM

(71) Applicant: Dell Products, LP, Round Rock, TX (US)

(72) Inventors: Qinghong He, Austin, TX (US); Travis C. North, Cedar Park, TX (US)

(73) Assignee: DELL PRODUCTS LP, Round Rock, TX (US)

(*) Notice: Subject to any disclaimer, the term of this patent is extended or adjusted under 35 U.S.C. 154(b) by 278 days.

(21) Appl. No.: 17/972,193

(22) Filed: Oct. 24, 2022

(65) Prior Publication Data

US 2024/0134427 A1 Apr. 25, 2024
US 2024/0231448 A9 Jul. 11, 2024

(51) Int. Cl.
*G06F 1/20* (2006.01)
*H01T 23/00* (2006.01)
*H05K 7/20* (2006.01)

(52) U.S. Cl.
CPC ............. *G06F 1/203* (2013.01); *H01T 23/00* (2013.01); *H05K 7/20172* (2013.01); *H05K 7/20409* (2013.01)

(58) Field of Classification Search
CPC ..... G06F 1/203; H01T 23/00; H05K 7/20172; H05K 7/20409
See application file for complete search history.

(56) References Cited

U.S. PATENT DOCUMENTS

| 7,215,526 B2 | 5/2007 | Constantinos | |
|---|---|---|---|
| 2005/0194583 A1* | 9/2005 | Taylor | F24F 8/192 257/10 |
| 2009/0155090 A1 | 6/2009 | Schlitz | |
| 2009/0207547 A1* | 8/2009 | Terasaki | B03C 3/368 361/231 |
| 2010/0177519 A1 | 7/2010 | Schlitz | |
| 2010/0277844 A1* | 11/2010 | Lueck | G06F 1/20 361/231 |
| 2010/0328837 A1* | 12/2010 | Lee | H01T 23/00 361/231 |

(Continued)

FOREIGN PATENT DOCUMENTS

EP 0644711 A1 3/1995
WO 2019/226712 A1 11/2019

*Primary Examiner* — Scott Bauer
(74) *Attorney, Agent, or Firm* — Prol Intellectual Property Law, PLLC; H. Kenneth Prol

(57) ABSTRACT

An information handling system includes a processor, a memory device, and a PMU to provide power to the processor and memory device. The information handling system further includes an ion emitter/collector blower cooling system including an ion emitter including an inner ring of vertically arranged ion emitter blades and an ion collector including an outer ring of vertically arranged ion collector blades. The cooling system includes an ionic driving circuit operatively coupled to the ion emitter to couple a first voltage to the ion collector blades to ionize gases at the ion emitter to create charged ions and the ionic driving circuit operatively coupled to the ion collector to apply a second voltage to attract the charged ions from the ion emitter to create an airflow, the airflow passing through the outer ring and out of an external opening of an ion emitter/collector housing of the ion emitter/collector blower cooling system.

20 Claims, 6 Drawing Sheets

(56) References Cited

U.S. PATENT DOCUMENTS

| | | | |
|---|---|---|---|
| 2011/0292593 A1 | 12/2011 | June | |
| 2012/0002342 A1* | 1/2012 | Lee | H01T 23/00 |
| | | | 361/231 |
| 2012/0049083 A1* | 3/2012 | Hung | H01T 19/04 |
| | | | 250/423 R |
| 2012/0091234 A1 | 4/2012 | Carmein | |
| 2012/0120542 A1* | 5/2012 | Zhang | H05K 7/20172 |
| | | | 361/230 |
| 2012/0300356 A1* | 11/2012 | Katano | H01T 23/00 |
| | | | 361/231 |
| 2013/0021715 A1 | 1/2013 | Jewell-Larsen | |
| 2013/0056241 A1* | 3/2013 | Gao | B03C 3/41 |
| | | | 427/125 |
| 2016/0111859 A1* | 4/2016 | Katano | H01T 23/00 |
| | | | 361/230 |
| 2017/0089611 A1 | 3/2017 | Yagoobi | |
| 2019/0111405 A1* | 4/2019 | Katano | A61L 2/202 |
| 2021/0143722 A1 | 5/2021 | Ieta | |
| 2021/0164704 A1 | 6/2021 | Puago Martinez | |
| 2021/0402413 A1 | 12/2021 | Kim | |

* cited by examiner

METHOD AND APPARATUS FOR A SILENT BLOWER IN AN INFORMATION HANDLING SYSTEM

FIELD OF THE DISCLOSURE

The present disclosure generally relates to cooling systems for information handling system. The present disclosure more specifically relates to ion emitters used to cool an information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling needs and requirements vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. Under various operating conditions, especially high-performance conditions, information handling systems may generate heat which, if not mitigated, may affect performance. The information handling system may thus include a cooling system used to cool hardware therein such as a processing device.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
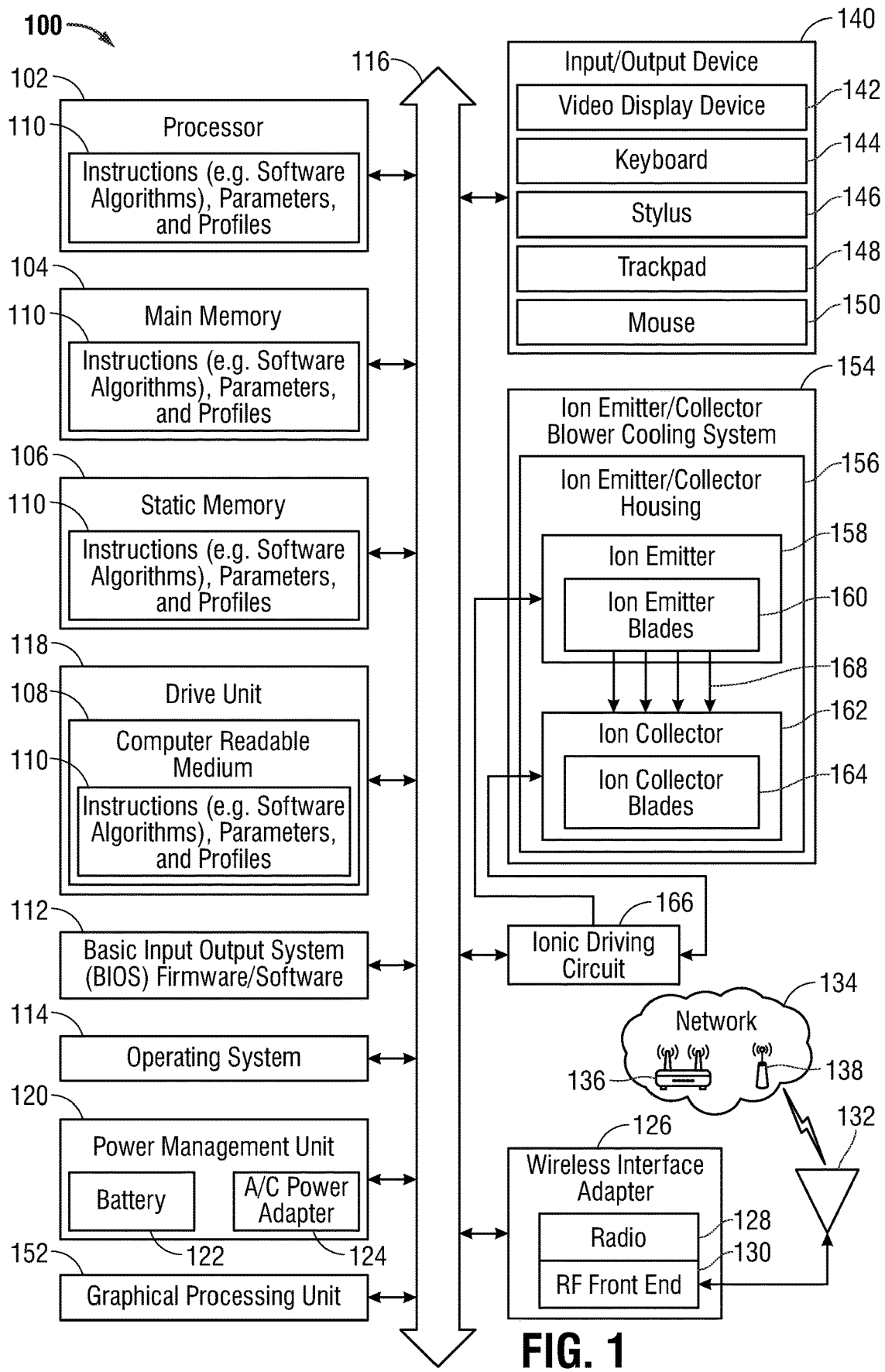
FIG. 1 is a block diagram of an information handling system including a cooling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Information handling systems operate to provide computing, data storage, and application resources among other computing resources. The hardware used to provide these resources to the user consume electricity. As a result of the consumption of this electricity, heat is produced within the housing or other structures used to house the hardware. Some information handling systems include a fan used to blow heat from within the housing to a vent to vent the heated air from within the housing. However, these fans may create a higher degree of noise that may interfere with the use of the information handling system especially when the fan speed is increased due to increased power consumption and a resulting increase in temperature within the housing.

The present specification describes an information handling system that includes a processor, a memory device, and a power management unit (PMU) to provide power to the processor and memory device. The PMU may be operatively coupled to an ion emitter/collector blower cooling system used to cool heat-generating hardware components within the housing of the information handling system. The ion emitter/collector blower cooling system includes an ion emitter including an inner ring of vertically arranged ion emitter blades and an ion collector including an outer ring of vertically arranged ion collector blades. The PMU and the ion collector and ion emitter may be operatively coupled to an ionic driving circuit. The ionic driving circuit is operatively coupled to the ion emitter to couple a first voltage to the inner ring of vertically arranged ion emitter blades to ionize gases at the ion emitter. This causes the charged ions to be repelled from the ion emitter to create an airflow from the ion emitter to the ion collector, the airflow passing through the outer ring of vertically arranged ion collector blades and out of an external opening of a housing of the ion emitter/collector blower cooling system. In an embodiment, the ion emitter/collector blower cooling system includes an ion collector including an inner ring of vertically arranged ion collector blades and an ion emitter including an outer ring of vertically arranged ion emitter blades. The PMU and the ion collector and ion emitter may be operatively coupled to an ionic driving circuit. The ionic driving circuit operatively coupled to the ion emitter to couple a first voltage to the outer ring of vertically arranged ion emitter blades to ionize gases at the ion emitter. This causes the charged ions to be repelled from the outer ring of vertically arranged ion emitter blades to create an airflow from the ion emitter to the ion collector, the airflow passing through the inner ring of vertically arranged ion collector blades and out of an external opening, a center aperture formed in the housing of the ion emitter/collector blower cooling system. This center aperture formed in the housing of the ion emitter/collector blower cooling system may be either on the top or the bottom of the housing. Accordingly, it is appreciated that the outer ring may operate as either an ion emitter or ion collector while the inner ring operates as an ion collector or ion emitter, respectively. In an embodiment, the PMU, with the ionic driving circuit, may dynamically change the voltage applied to the outer ring and inner ring of blades in order to dynamically change the operation of these rings so as to change the direction of airflow within the housing of the ion emitter/collector blower cooling system.

In an embodiment, the ion collector is formed at the external opening of the ion emitter/collector blower housing to provide a deionization source for the ionized gases formed at the vertically arranged ion emitter blades of an inner ring, the ion collector operatively coupled to the ionic driving circuit to create an attractive force via a second voltage at the ion collector to attract the ionized gas. Still further, a center aperture in the ion emitter/collector housing serves as a center air inlet is formed above the inner ring of vertically arranged ion emitter blades to draw air into the housing of the ion emitter/collector blower cooling system.

In an embodiment, the outer ring of vertically arranged ion collector blades of the ion collector operate as thermal fins used to dissipate heat from the information handling system via the airflow created by the attractive movement of the ionized gas to the ion collector. The outer ring of vertically arranged ion collector blades, in an embodiment, may be operatively coupled to a passive heat conducting device so that heat from the heat-generating hardware components within the information handling system is conducted to the outer ring of vertically arranged ion collector blades. As airflow passes over the outer ring of vertically arranged ion collector blades this heat is drawn out of the housing of the ion emitter/collector blower cooling system via the airflow.

FIG. 1 illustrates an information handling system 100 similar to information handling systems according to several aspects of the present disclosure that is operatively couplable to a cooling system (e.g., ion emitter/collector blower cooling system 154) formed within a housing of the information handling system. In the embodiments described herein, an information handling system 100 includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a convertible laptop, a tablet, a smartphone, a communications device, an access point (AP), a base station transceiver, a wireless telephone, a control system, a camera, a scanner, a printer, a personal trusted device, a web appliance, or any other suitable machine capable of executing a set of machine-readable code instructions (sequential or otherwise) that specify actions to be taken by that machine, and can vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the computer system 100 can be implemented using electronic devices that provide voice, video, or data communication. For example, an information handling system 100 may be any mobile or other computing device capable of executing a set of machine-readable code instructions (sequential or otherwise) that specify actions to be taken by that machine. In an embodiment, the information handling system 100 may be operatively coupled to a server or other network device as well as with any wireless peripheral devices. Further, while a single information handling system 100 is illustrated, the term "system" shall also be taken to include any collection of systems or sub-systems that individually or jointly execute a set, or multiple sets, of machine-readable code instructions to perform one or more computer functions.

The information handling system 100 may include memory (volatile (e.g., random-access memory, etc.), non-volatile (read-only memory, flash memory etc.) or any combination thereof), one or more hardware processing resources, such as a central processing unit (CPU), a graphics processing unit (GPU) 152, hardware controller, or any combination thereof. Additional components of the information handling system 100 can include one or more storage devices, one or more communications ports for communicating with external devices, as well as various input and output (I/O) devices 140, such as a keyboard 144, a mouse 150, a video display device 142, a stylus 146, a trackpad 148, or any combination thereof. The information handling system 100 can also include one or more buses 116 operable to transmit data communications between the various hardware components described herein. Portions of an information handling system 100 may themselves be considered information handling systems and some or all of which may be wireless.

Information handling system 100 can include hardware processing resources that execute machine-readable code instructions for the one or more software or firmware systems and modules described above, and operates to perform one or more of the methods described herein. For example, machine-readable code instructions may be executed by a PMU hardware controller or other hardware processing resource for an ion emitter/collector blower cooling system 154 to control the ion emitter/collector blower cooling system 154 of embodiments herein. The information handling system 100 may execute machine-readable code instructions 110 via hardware processing resources that may operate on servers or systems, remote data centers, or on-box in individual client information handling systems according to various embodiments herein. In some embodiments, it is understood any or all portions of machine-readable code instructions 110 may operate on a plurality of information handling systems 100.

The information handling system 100 may include hardware processing resources such as a hardware processor 102, a central processing unit (CPU), accelerated processing unit (APU), a neural processing unit (NPU), a vision processing unit (VPU), an embedded controller (EC), a digital signal processor (DSP), a GPU 152, a microcontroller, or any other type of hardware processing device that executes machine-readable code instructions to perform the processes described herein. Any of the hardware processing resources may operate to execute machine-readable code that is either firmware or software code. Moreover, the information handling system 100 can include memory such as main memory 104, static memory 106, computer readable medium 108 storing machine-readable code instructions 110 of, in an example embodiment, an ion emitter/collector blower cooling system 154 (e.g., controlled by a power management unit (PMU) controller associated with the PMU 120), or other computer executable program code, and drive unit 118 (volatile (e.g., random-access memory, etc.), nonvolatile (read-only memory, flash memory etc.) or any combination thereof).

As shown, the information handling system 100 may further include a video display device 142. The video display device 142, in an embodiment, may function as a liquid crystal display (LCD), an organic light emitting diode (OLED), a flat panel display, or a solid-state display. Although FIG. 1 shows a single video display device 142, the present specification contemplates that multiple video display devices 142 may be used with the information handling system to facilitate an extended desktop scenario, for example. Additionally, the information handling system 100 may include one or more input/output devices 140 including an alpha numeric input device such as a keyboard 144 and/or a cursor control device, such as a mouse 150, touchpad/trackpad 148, a stylus 146, or a gesture or touch screen input device associated with the video display device 142 that allow a user to interact with the images, windows, and applications presented to the user. In an embodiment, the video display device 142 may provide output to a user that includes, for example, one or more windows describing one or more instances of applications being executed by the processor 102 of the information handling system. In this example embodiment, a window may be presented to the user that provides a graphical user interface (GUI) representing the execution of that application.

The network interface device of the information handling system 100 shown as wireless interface adapter 126 can provide connectivity among devices such as with Bluetooth® or to a network 134, e.g., a wide area network (WAN), a local area network (LAN), wireless local area network (WLAN), a wireless personal area network (WPAN), a wireless wide area network (WWAN), or other network. In an embodiment, the WAN, WWAN, LAN, and WLAN may each include an access point 136 or base station 138 used to operatively couple the information handling system 100 to a network 134. In a specific embodiment, the network 134 may include macro-cellular connections via one or more base stations 138 or a wireless access point 136 (e.g., Wi-Fi or WiGig), or such as through licensed or unlicensed WWAN small cell base stations 138. Connectivity may be via wired or wireless connection. For example, wireless network access points 136 or base stations 138 may be operatively connected to the information handling system 100. Wireless interface adapter 126 may include one or more radio frequency (RF) subsystems (e.g., radio 128) with transmitter/receiver circuitry, modem circuitry, one or more antenna front end circuits 130, one or more wireless controller circuits, amplifiers, antennas 132 and other circuitry of the radio 128 such as one or more antenna ports used for wireless communications via multiple radio access technologies (RATs). The radio 128 may communicate with one or more wireless technology protocols. In and embodiment, the radio 128 may contain individual subscriber identity module (SIM) profiles for each technology service provider and their available protocols for any operating subscriber-based radio access technologies such as cellular LTE communications.

In an example embodiment, the wireless interface adapter 126, radio 128, and antenna 132 may provide connectivity to one or more of the peripheral devices that may include a wireless video display device 142, a wireless keyboard 144, a wireless mouse 150, a wireless headset, a microphone, a wireless stylus 146, and a wireless trackpad 148, among other wireless peripheral devices used as input/output (I/O) devices 140.

The wireless interface adapter 126 may include any number of antennas 132 which may include any number of tunable antennas for use with the system and methods disclosed herein. Although FIG. 1 shows a single antenna 132, the present specification contemplates that the number of antennas 132 may include more or less of the number of individual antennas shown in FIG. 1. Additional antenna system modification circuitry (not shown) may also be included with the wireless interface adapter 126 to implement coexistence control measures via an antenna controller in various embodiments of the present disclosure.

In some aspects of the present disclosure, the wireless interface adapter 126 may operate two or more wireless links. In an embodiment, the wireless interface adapter 126 may operate a Bluetooth® wireless link using a Bluetooth® wireless or Bluetooth® Low Energy (BLE). In an embodiment, the Bluetooth® wireless protocol may operate at frequencies between 2.402 to 2.48 GHz.

The wireless interface adapter 126 may operate in accordance with any wireless data communication standards. To communicate with a wireless local area network, standards including IEEE 802.11 WLAN standards (e.g., IEEE 802.11ax-2021 (Wi-Fi 6E, 6 GHz)), IEEE 802.15 WPAN standards, WWAN such as 3GPP or 3GPP2, Bluetooth® standards, or similar wireless standards may be used. Wireless interface adapter 126 may connect to any combination of macro-cellular wireless connections including 2G, 2.5G, 3G, 4G, 5G or the like from one or more service providers. Utilization of radio frequency communication bands according to several example embodiments of the present disclosure may include bands used with the WLAN standards and WWAN carriers which may operate in both licensed and unlicensed spectrums.

The wireless interface adapter 126 can represent an add-in card, wireless network interface module that is integrated with a main board of the information handling system 100 or integrated with another wireless network interface capability, or any combination thereof. In an embodiment the wireless interface adapter 126 may include one or more radio frequency subsystems including transmitters and wireless controllers for connecting via a multitude of wireless links. In an example embodiment, an information handling system 100 may have an antenna system transmitter for Bluetooth®, BLE, 5G small cell WWAN, or Wi-Fi WLAN connectivity and one or more additional antenna system transmitters for macro-cellular communication. The RF subsystems and radios 128 and include wireless controllers to manage authentication, connectivity, communications, power levels for transmission, buffering, error correction, baseband processing, and other functions of the wireless interface adapter 126.

As described herein, the information handling system 100 may include and be operatively coupled to an ion emitter/collector blower cooling system 154. The ion emitter/collector blower cooling system 154 may be coupled within a housing of the information handling system 100 in an embodiment so that heat generated by the operation of the hardware (e.g., processor 102, memory devices 104, 106, PMU 120, etc.) may be directed out of the housing of the information handling system 100 via a heat vent formed in the housing. The ion emitter/collector blower cooling system 154 may include an ion emitter/collector housing 156 used to house the components of the ion emitter/collector blower cooling system 154 described herein in an embodiment. In an alternative embodiment, the ion emitter/collector blower cooling system 154 does not include an ion emitter/collector housing 156 and instead, those components of the ion emitter/collector blower cooling system 154 are operatively coupled to the housing of the information handling system 100. For ease of discussion, the ion emitter/collector blower cooling system 154 will be described as including the ion emitter/collector housing 156 which allows the ion emitter/collector blower cooling system 154 to be modular and replaced if necessary.

The ion emitter/collector blower cooling system 154 includes an ion emitter 158. The ion emitter 158 may include a plurality of vertically arranged ion emitter blades used to create an airflow out of the ion emitter/collector housing 156. The number of vertically arranged ion emitter blades may vary depending on an anticipated level of heat generation by the hardware within the information handling system 100 and the shape and design of the ion emitter/collector housing 156 or housing of the information handling system 100, among other factors. In an embodiment, the inner ring of vertically arranged ion emitter blades are arranged generally parallel to an airflow created by the movement of the charged ions from the inner ring of vertically arranged ion emitter blades to the outer ring of vertically arranged ion collector blades. Each of the vertically arranged ion emitter blades are electrically and physically coupled to each other in a ring in an embodiment. In an embodiment, the vertically arranged ion emitter blades may be part of an inner ring of vertically arranged ion emitter blades. In another embodiment, the vertically arranged ion emitter blades may be part of an outer ring of vertically arranged ion emitter blades. In an embodiment, each of the vertically arranged ion emitter blades may include a point or surface at which electrons may be stripped from gas molecules present in the atmosphere at or around the emitter blades 160 to create charged ions. In one embodiment, these edges or surfaces may be made to come to sharp point facing the ion collector 162 in order to efficiently facilitate the creation of more charged ions. In an embodiment, the ion emitter 158 and the emitter blades 160 may be made of a refractory metal such as niobium, chromium, molybdenum, tantalum, tungsten, and rhenium among others. In an embodiment, the portions of the ion emitter 158 and emitter blades 160 may be electroplated with a refractory metal such as niobium, chromium, molybdenum, tantalum, tungsten, and rhenium among others with an interior layer of the ion emitter 158 and emitter blades 160 being made of a conductive material such as iron. It is appreciated that the ion emitter 158 and emitter blades 160 may be made of any alloy of metal that includes alloys of those refractory metals described herein.

In an embodiment, the ion emitter/collector blower cooling system 154 includes an ion collector 162. The ion collector 162 may include a plurality of collector blades 164. In an embodiment, an outer ring of vertically arranged ion collector blades are arranged generally parallel to an airflow created by the movement of the charged ions from the inner ring of vertically arranged ion emitter blades to the outer ring of vertically arranged ion collector blades for example. In an embodiment, these collector blades 164 are arranged vertically in an outer ring radially away from the inner ring of vertically arranged ion emitter blades 160 of the ion emitter 158. In an alternative embodiment, the vertically arranged ion collector blades may be part of an inner ring of vertically arranged ion collector blades. Each of the vertically arranged ion collector blades 162 are electrically and physically coupled to each other at a ring in an embodiment with this ring having a diameter larger than the ring used to operatively coupled the inner ring of vertically arranged ion emitter blades 160 together. In an alternative embodiment, each of the vertically arranged ion collector blades 162 are electrically and physically coupled to each other at a ring with this ring having a diameter smaller than the ring used to operatively coupled the outer ring of vertically arranged ion emitter blades 160 together such that the ion collector forms an inner ring. In one embodiment, the vertically arranged ion collector blades may be part of an outer ring of vertically arranged ion collector blades 162. In an embodiment, each of the outer ring of ion collector blades 162 may include a surface at which the charged ions generated at the emitter blades 160 are received and deionized.

The ion emitter 158 and ion collector 162 may be operatively coupled to an ionic driving circuit 166. In an embodiment, the ionic driving circuit 166 is controlled via the processor 102, the PMU 120 with a hardware controller, or both. The ionic driving circuit 166, in an embodiment, includes a high voltage source with a positive electrode that is operatively coupled to the ion emitter 158 and a negative electrode that is operatively coupled to the ion collector 162. In an embodiment, the high voltage source may include a boost converter that steps up voltage from its input (e.g., a battery 122 or A/C power adapter 124) to the output at the ion emitter 158 and/or ion collector 162. The high voltage source of the ionic driving circuit 166 causes the ion emitter 158 to generate, repel, and emit charged ions 168 from the edges of the emitter blades 160. In the context of the present specification, the term "emit" or "emitter" is meant to describe an action and device that, at its edges or other surfaces, creates ions 168 and, via an electromagnetic repulsion, repels those charged ions 168 towards an attracting, oppositely charged source such as the ion collector 162 described herein. In an embodiment, the high voltage source of the ionic driving circuit 166 causes electrons to be ripped away from certain molecules such as gas molecules in the atmosphere thereby creating ions 168 (e.g., positively-charged ions) at the edges or other surfaces of the emitter blades 160. This ionization process may include the removal of one or more electrons from the outer valence shells of the individual molecules within the gases such that they become positively charged (e.g., cations) in an embodiment. In an example where the interior of the ion emitter/collector housing 156 includes atmospheric air, any number of types of gas molecules may be subjected to this process. For example, where the gas includes oxygen (O), the ionization of oxygen may include a free electron source to force the removal of a single electron or two electrons from the oxygen molecule or atom. This may lead to a $O^+$ or $O^{2+}$ ion (e.g., cation) being created by the ion emitter/collector blower cooling system 154 at the ion emitter 158 via the ionic driving circuit 166 in an embodiment. Other gas molecules or molecules within the atmosphere within the ion emitter/collector blower housing 156 may similarly be ionized such as nitrogen, carbon dioxide, argon, hydrogen, etc. to create other ions such as $N^{+1}$, $N^{+2}$, $N^{+3}$, $N^{+4}$, $N^{+5}$, $O_3$ (ozone), $H^{+1}$ and the like.

In an embodiment, the movement of the charged ions 168 from the ion emitter 158 to the ion collector 162 creates a shear force on other gas molecules whether ionically charged or not. This shear force drags these other gas molecules from the ion emitter 158 to the ion collector 162 creating an airflow from the ion emitter 158 towards the ion collector 162. Again, the voltage difference between the ion emitter 158 and ion collector 162 creates an electric field between the ion emitter 158 and ion collector 162 along which the charged ions 168 follow. The distance between the ion emitter 158 and ion collector 162 may dictate the strength of this electric field created thereby affecting the speed of the airflow created by the movement of the charged ions 168 repelled by the ion emitter 158 and attracted to the ion collector 162. The creation of this airflow via the ionic movement of the ions created by the ion emitter 160 has a low-pressure head of around 0.04 to 0.05 inches of $H_2O$ (water column) as compared to the rotation of a fan that has a pressure head of around 0.5 inches of $H_2O$. However, the flow rate of air into and out of the ion emitter/collector blower cooling system 154 via operation of the ion emitter 158 and ion collector 162 creating ions may be relatively higher than the potential flow rate of air created by the rotation of a fan or other blower. For purposes of the present specification, the term "pressure head" is defined as the height of a fluid (e.g., air, water, or other fluids) column that corresponds to a particular pressure exerted by the fluid column corresponding to pressure or psi of airflow created by the ionization of air by the ion emitter 158. By imparting relatively high airflow rate with lower pressure head, the acoustics of the ion emitter/collector blower cooling system 154 are reduced in an embodiment.

In an embodiment, the ion emitter 158 and ion collector 162 may be switched as an ion collector and ion emitter, respectively, with the ion collector structure switched to an ion emitter described herein generating the charged ions while the ion emitter structure is switched to a collector and receives and deionizes the charged ions. This allows the airflow created via movement of the charged ions to be reversed causing air to be drawn into the housing of the information handling system 100 from a previous outlet vent and out a previous inlet vent in some embodiments.

In an embodiment and in order to facilitate the creation of charged ions at the ion collector 162, the ion collector 162 may also include other emitter edges or surfaces such as emitter blades 160 that come to a sharp point in order to facilitate the creation of more charged ions in an embodiment. In an embodiment, the ion collector 162 and the collector structure such as collector blades 164 may be made of a refractory metal such as niobium, chromium, molybdenum, tantalum, tungsten, and rhenium among others. In an embodiment, the portions of the ion collector 162 and collector blades 164 may be electroplated with a refractory metal such as niobium, chromium, molybdenum, tantalum, tungsten, and rhenium among others with an interior layer of the collector blades 164 and ion collector 162 being made of a conductive material such as iron. It is appreciated that the ion collector 162 and collector blades 164 may be made of any alloy of metal that includes alloys of those refractory metals described herein. Additionally, the ionic driving circuit 166 may also switch the electrical polarity of the electrodes coupled to the ion emitter 158 and ion collector 162 with the ion emitter 158 being operatively coupled to a negative electrode of the ionic driving circuit 166 and the ion collector 162 operatively coupled to the positive electrode of the ionic driving circuit 166 thereby allowing the ion collector 162 to operate as the ion emitter as described herein. As described herein, the reversal of this airflow within the housing of the information handling system 100. In one embodiment, active reversal of airflow may allow the ion emitter/collector blower cooling system 154 to initiate a dust cleaning process that removes dust from surfaces within the ion emitter/collector housing 156 and housing of the information handling system 100. Once this airflow is created, the airflow may, again, be reversed so that air passes out of the ion emitter/collector housing 156 and housing of the information handling system 100 to expel any loosened dust or particles that may have accumulated.

As described herein, the electric field may be created via a voltage difference between the ion emitter 158 and ion collector 162 operatively coupled to the ionic driving circuit 166. In an embodiment, the ion collector 162 may be operatively coupled to ground such that the voltage difference between the ion emitter 158 and ion collector 162 is present while the ion emitter/collector blower cooling system 154 is protected from any occurrences of arcing.

In an embodiment, the airflow created by this movement of the ions 168 may supplement the airflow created via the rotation of a fan or another type of blower. As such, in an embodiment, the rotation of the fan or operation of the blower may be reduced in speed or stopped as compared to other fans that do not operate with an ion emitter/collector blower cooling system 154 in the information handling system 100. Because the movement of the ions 168 creates an airflow, in some embodiments, the rotation of the fan or operation of another blower may be stopped allowing the cooling of the hardware within the housing of the information handling system 100 by the ion emitter/collector blower cooling system 154. In some embodiments where the heat of the hardware within the housing of the information handling system 100 increases above one or more temperature thresholds, the processor 102 may direct the motor driver hardware to drive the fan or operate another blower so that the additional airflow created by the rotation of the fan or operation of the other blower. This allows the noises associated with the rotation of a fan to be reduced or even eliminated during relatively cool temperatures within the housing of the information handling system 100 thereby decreasing the noise heard by the user of the information handling system 100. As a result, in an embodiment, the ion emitter/collector blower cooling system 154 described herein may have a noiseless base capability of cooling the information handling system 100 with a backup cooling system via actuation of a fan or blower. This may further increase the user satisfaction of the information handling system 100 during operation of the information handling system 100 by decreasing fan noise heard by the user. Still further, because of the layout of the inner ring of vertically arranged ion emitter blades 160 and outer ring of vertically arranged ion collector blades 164 or vice-versa, relatively less space is needed to create an airflow throughout the housing of the information handling system 100 as compared to, for example, a fan or blower. In an embodiment, the ion emitter/collector blower cooling system 154 may reduce the horizontal space occupied by the ion emitter/collector blower cooling system 154 as compared to a fan or blower. Additionally, the operation of the ion emitter/collector blower cooling system 154 described herein allows for a top and/or bottom air inlet or air exhaust to be formed allowing air to be drawn into or vented out of the top of the ion emitter/collector housing 156 and out or drawn into, respectively, one or more exhaust vents formed in a side of the ion emitter/collector housing 156. Allowing, in an example embodiment, for air to be exhausted out of a bottom or top inlet in the ion emitter/collector housing 156 allows for easier exhaust of heat from within the information handling system 100 form a bottom surface or top surface of a base chassis of an information handling system. Such an exhaust vent is difficult or bulky to construct with a conventional fan or other type of blower.

In an embodiment, the outer ring of vertically arranged ion collector blades 164 of the ion collector 162 may operate as thermal fins. In this embodiment, the collector blades 164 may be operatively coupled to a heat sink, a heat pipe, a vapor chamber, or other passive heat conducting devices so that heat may be conducted into the collector blades 164. As airflow passes by the outer ring of vertically arranged ion collector blades 164, the heat may be drawn out of the housing of the information handling system 100. Additionally, or alternatively, these passive heat conducting devices may be operatively coupled to the emitter blades 160 for the heat to be dissipated via the airflow as described.

In an embodiment, an inner ring of vertically arranged ion collector blades 164 of the ion collector 162 may operate as thermal fins. In this embodiment, the collector blades 164 may be operatively coupled to a heat sink, a heat pipe, a vapor chamber, or other passive heat conducting devices so that heat may be conducted past the collector blades 164. As airflow passes by the inner ring of vertically arranged ion collector blades 164, the heat may be drawn out of the housing of the information handling system 100. Additionally, or alternatively, these passive heat conducting devices may be operatively coupled to the emitter blades 160 for the heat to be dissipated via the airflow as described.

The information handling system 100 can include one or more set of machine-readable code instructions 110 that can be executed to cause the computer system to perform any one or more of the methods or computer-based functions disclosed herein. For example, machine-readable code instructions 110 may execute various software applications, software agents, a basic input/output system (BIOS) 112 firmware and/or software, or other aspects or components. Machine-readable code instructions 110 may execute an ionic driving circuit 166 system to control various aspects of the ion emitter/collector blower cooling system 154 of the embodiments herein. Various software modules comprising application instructions 110 may be coordinated by an operating system (OS) 114, and/or via an application programming interface (API). An example OS 114 may include Windows®, Android®, and other OS types known in the art. Example APIs may include Win 32, Core Java API, or Android APIs.

The disk drive unit 118 and may include a computer-readable medium 108 in which one or more sets of machine-readable code instructions 110 such as software can be embedded to be executed by the processor 102 or other hardware processing devices such as a GPU 152 to perform the processes described herein. Similarly, main memory 104 and static memory 106 may also contain a computer-readable medium for storage of one or more sets of machine-readable code instructions, parameters, or profiles 110 described herein. The disk drive unit 118 or static memory 106 also contain space for data storage. Further, the machine-readable code instructions 110 may embody one or more of the methods as described herein. In a particular embodiment, the machine-readable code instructions, parameters, and profiles 110 may reside completely, or at least partially, within the main memory 104, the static memory 106, and/or within the disk drive 118 during execution by the processor 102 or GPU 152 of information handling system 100. The main memory 104, GPU 152, and the hardware processor 102 also may include computer-readable media.

Main memory 104 or other memory of the embodiments described herein may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The applications and associated APIs, for example, may be stored in static memory 106 or on the drive unit 118 that may include access to a computer-readable medium 108 such as a magnetic disk or flash memory in an example embodiment. While the computer-readable medium is shown to be a single medium, the term "computer-readable medium" includes a single medium or multiple media, such as a centralized or distributed database, and/or associated caches and servers that store one or more sets of machine-readable code instructions. The term "computer-readable medium" shall also include any medium that is capable of storing, encoding, or carrying a set of machine-readable code instructions for execution by a processor or that cause a computer system to perform any one or more of the methods or operations disclosed herein.

In an embodiment, the information handling system 100 may further include a power management unit (PMU) 120 (a.k.a. a power supply unit (PSU)). The PMU 120 may include a hardware controller and executable machine-readable code instructions to manage the power provided to the components of the information handling system 100 such as the hardware processor 102, and manage control of the ion emitter/collector blower cooling system 154 such as via the ionic driving circuit 166 that includes the ion emitter 158 and ion collector 162. The PMU 120 may control power to one or more components including the ion emitter 158, ionic driving circuit 166, ion collector 162, one or more drive units 118, the hardware processor 102 (e.g., CPU), the GPU 152, a video/graphic display device 142 or other input/output devices 140 such as the stylus 146, a mouse 150, a keyboard 144, and a trackpad 148 and other components that may require power when a power button has been actuated by a user. In an embodiment, the PMU 120 may monitor power levels or temperature via thermistors and be electrically coupled, either wired or wirelessly, to the information handling system 100 to provide this power and coupled to bus 116 to provide or receive data or machine-readable code instructions. The PMU 120 may regulate power from a power source such as a battery 122 or A/C power adapter 124. In an embodiment, the battery 122 may be charged via the A/C power adapter 124 and provide power to the components of the information handling system 100 via a wired connections as applicable, or when A/C power from the A/C power adapter 124 is removed. PMU 120 may include a hardware controller to execute machine-readable code instructions 110 for an emitter/collector control system of an ion emitter/collector blower cooling system 154 to control the ion emitter 158 and ion collector 162 based on detected temperature thresholds or selection of airflow direction according to embodiments of the present disclosure.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or machine-readable code instructions may be stored.

In other embodiments, dedicated hardware implementations such as application specific integrated circuits (ASICs), programmable logic arrays and other hardware devices can be constructed to implement one or more of the methods described herein. One or more embodiments described herein may implement functions using two or more specific interconnected hardware modules or devices with related control and data signals that can be communicated between and through the modules, or as portions of an application-specific integrated circuit. Accordingly, the present system encompasses hardware executing software or firmware, and hardware implementations.

When referred to as a "system," a "device," a "module," a "hardware controller," or the like, the embodiments described herein can be configured as hardware or hardware executing machine-readable code instructions. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The system, device, hardware controller, or module can include software, including firmware embedded at a device, for execution with hardware processing resources such as an Intel® Core class processor, ARM® brand processors, Qualcomm® Snapdragon processors, or other processors and chipsets, or other such hardware processing device capable of operating a relevant environment of the information handling system. The system, device, controller, or module can also include a combination of the foregoing examples of hardware or hardware executing software or firmware. Note that an information handling system can include an integrated circuit or a board-level product having portions thereof that can also be any combination of hardware and hardware executing software or firmware. Devices, modules, resources, or hardware controllers that are in communication with one another need not be in continuous communication with each other, unless expressly specified otherwise. In addition, devices, modules, resources, or hardware controllers that are in communication with one another can communicate directly or indirectly through one or more intermediaries.

Figure 2:
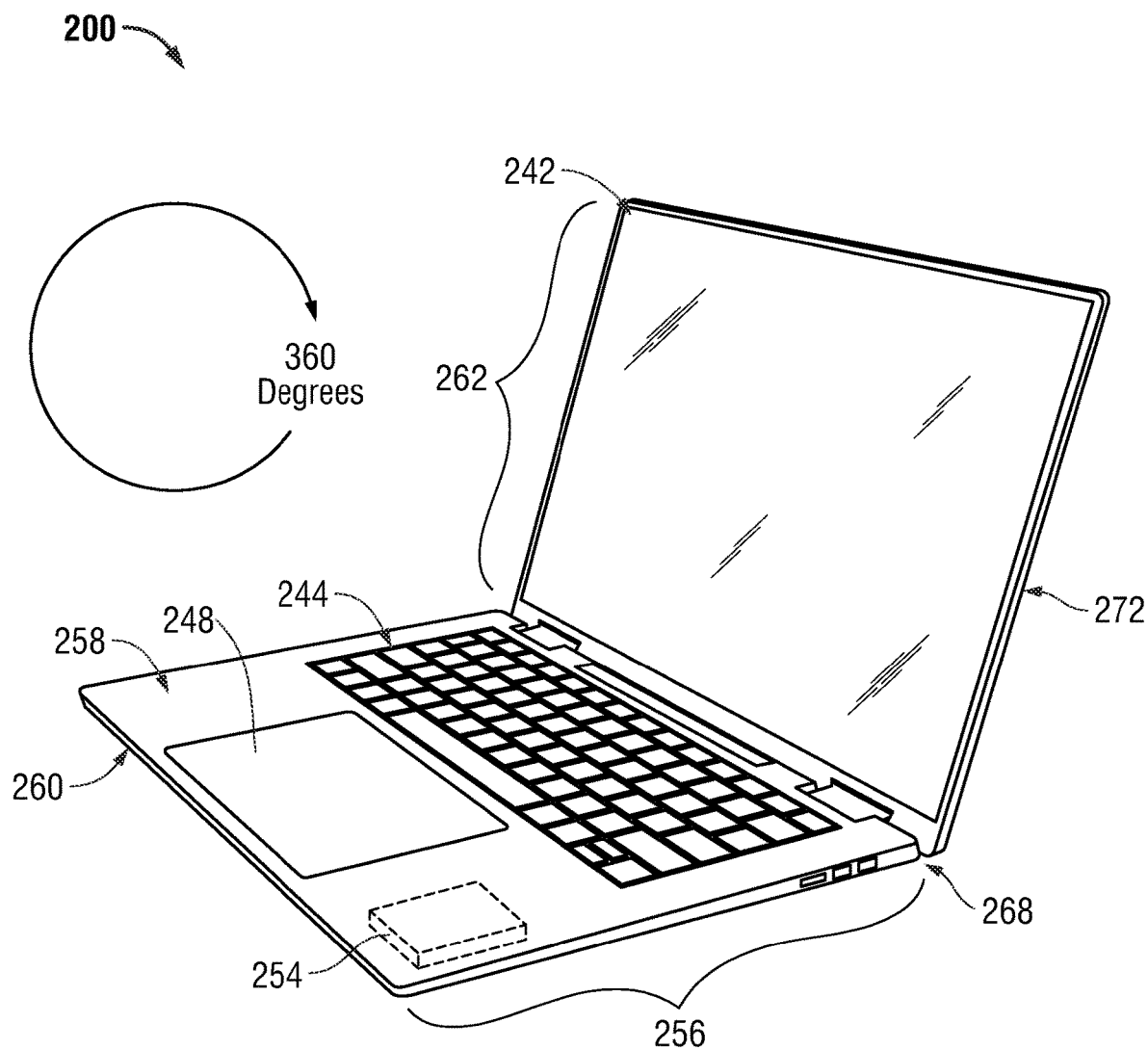
FIG. 2 is a graphic diagram of an information handling system housing an ion emitter/collector blower cooling system according to an embodiment of the present disclosure.

FIG. 2 is a graphic diagram of an information handling system housing an ion emitter/collector blower cooling system according to an embodiment of the present disclosure. The information handling system 200 may, in an example embodiment, be a laptop-type information handling system 200. In the example shown in FIG. 2, the information handling system 200 may be a 360° information handling system 200 where an exterior surface of the d-cover 260 or bottom cover of a base chassis 256 may be brought towards an exterior side of the a-cover 272 or back display cover of the display chassis 262 to place the information handling system 200 in a tablet configuration in one embodiment. As shown in FIG. 2, the information handling system 200 may also be placed in a laptop configuration as shown in FIG. 2 where the base chassis 256 is lying flat on a surface with the display chassis 262 being placed upright from the base chassis 256. Other configurations such as a dual tablet configuration and a tent orientation are contemplated as described herein.

As described herein, the information handling system 200 may include a plurality of chassis made of metal, plastic, or the like. The information handling system 200, in an embodiment, may comprise an outer case or shell of an information handling system 200 for housing internal components of the information handling system 200, such as a video display device, a cursor control device, and an alpha numeric input device (e.g., keyboard 244). As shown in FIG. 2, the information handling system 200 may include a video display device/b-cover 242 functioning to enclose the video display chassis 262 with the a-cover or back display cover 270 described herein.

As another example, the information handling system 200 may further include the c-cover 258 or top cover functioning to enclose a cursor control device such as a trackpad 248 and/or a keyboard 244 acting as an alpha numeric input device. The a-cover 270 or back display cover and the video display device/b-cover 242 may be joined together in an embodiment to form a fully enclosed display chassis 262, while the c-cover 258 or top cover and the d-cover 260 or bottom cover may be joined together to form a fully enclosed base chassis 256. Taking a closed configuration as a reference position of the display chassis 262 including the a-cover 270 and the video display device/b-cover 242 and the base chassis 256 including the c-cover 258 and the d-cover 260, the display chassis 262 including the a-cover 270 and the video display device/b-cover 242 may be rotated away from the base chassis 256 into the laptop configuration as shown in FIG. 2.

As described herein, an exhaust vent or inlet vent depending on ion emitter and ion collector configuration (not shown) may be formed on a rear surface where the d-cover 260 and c-cover 258 are coupled together, on a side surface where the d-cover 260 and c-cover 258 are coupled together. In some example embodiments described herein, an inlet vent or exhaust vent may be disposed on a bottom side of the d-cover 260 allowing an airflow to pass up into or out from underneath the information handling system 100. In some example embodiments described herein, an inlet vent or exhaust vent may be disposed on a top side of the c-cover or top cover 258 allowing an airflow to down into or out from within the information handling system 100. Additionally, the base chassis 256 may be operatively coupled to a display chassis 262 via a hinge 264. In an embodiment, this hinge 264 may be a drop-down hinge that drops the display chassis 262 down as the display chassis 262 is placed in an open position as shown.

As described herein, the ion emitter/collector blower cooling system shown at an ion emitter/collector blower cooling system location 254 is located within the housing information handling system 200. The ion emitter/collector blower cooling system location 254 may, in an example embodiment, be at any location in, for example the base chassis 256, of the information handling system 200. The ion emitter/collector blower cooling system location 254 can be configured in a variety of configurations that include an inlet/exhaust vent draws air in or that expels heat downward and out of the base chassis 256 of the information handling system 100. The ion emitter/collector blower cooing system at the ion emitter/collector blower cooing system location 254 may have a controlled dirt cleaning operation (e.g., where the ion emitter and ion collector are switched to operate as an ion collector and ion emitter, respectively) so that airflow into to the base chassis 256 via an exhaust vent and out via an air inlet vent formed in the housing of the information handling system 200 may dislodge dust or dirt via reverse airflow. The inlet vent and exhaust vent may be formed into any housing (e.g., c-cover 258 and d-cover 260) or a top or bottom along any side of a base chassis 256 of the information handling system 200 to either intake cool air into the housing of the information handling system 200 or exhaust heated air out of the housing of the information handling system 200.

Figure 3:
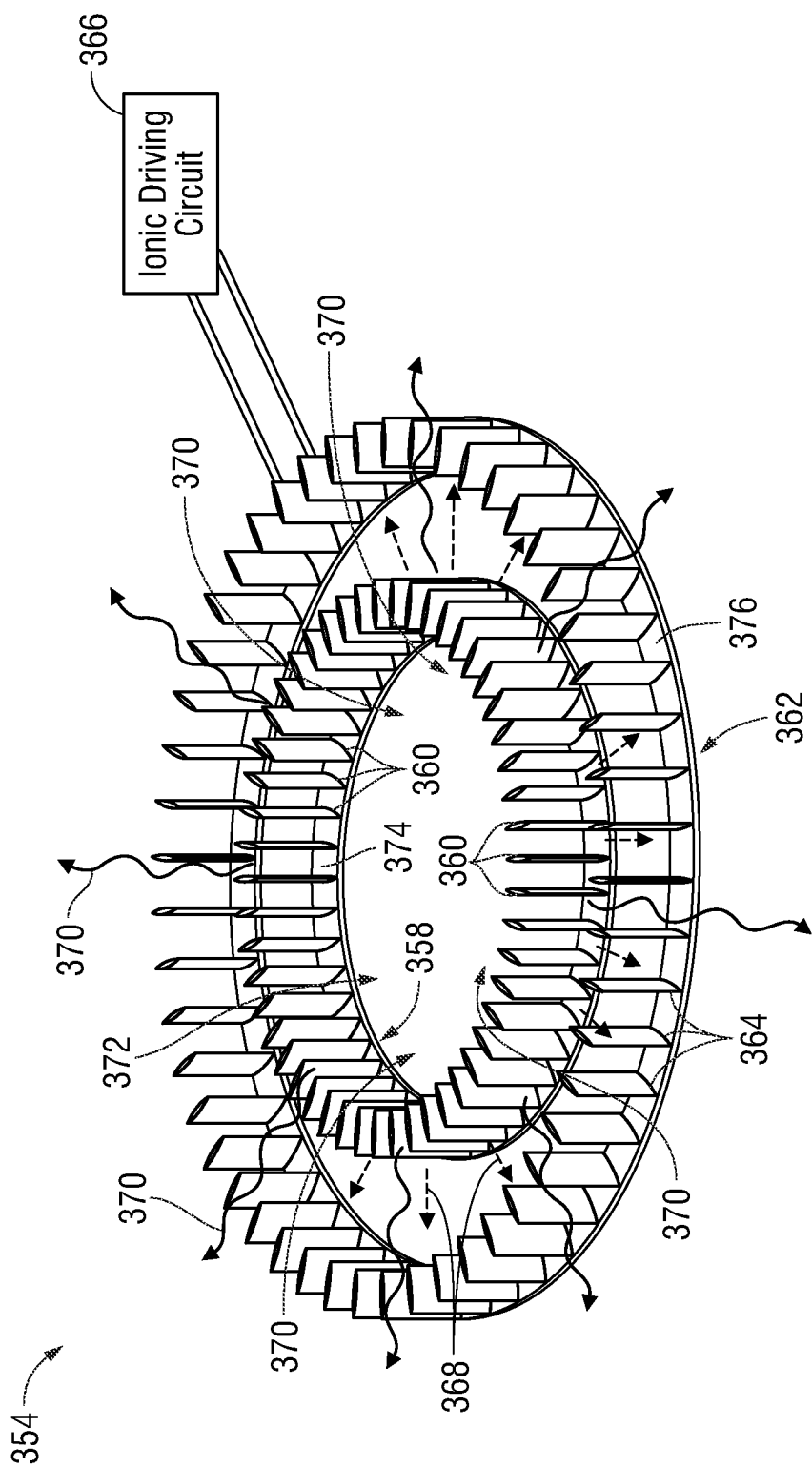
FIG. 3 is a graphic diagram perspective view of an inner ring of vertically arranged ion emitter blades and an outer ring of vertically arranged ion collector blades of an ion emitter/collector blower cooling system according to an embodiment of the present disclosure.

FIG. 3 is a graphic diagram perspective view of an inner ring of vertically arranged ion emitter blades 358 and an outer ring of vertically arranged ion collector blades 362 of an ion emitter/collector blower cooling system 354 according to an embodiment of the present disclosure. As described herein, the ion emitter/collector blower cooling system 354 includes an ion emitter 358. The ion emitter 358 may include a plurality of vertically arranged ion emitter blades 360 used to create an airflow out of the ion emitter/collector housing (not shown) into which the ion emitter 358 and ion collector 362 are housed. The number of vertically arranged ion emitter blades 360 may vary depending on an anticipated level of heat generation by the hardware within the information handling system 100 or on the shape and design of the ion emitter/collector housing or housing of the information handling system, among other factors. Each of the vertically arranged ion emitter blades 360 are electrically and physically coupled to each other at an ion emitter base ring 374 in an embodiment. In an embodiment, the vertically arranged ion emitter blades 360 may be part of an inner ring of vertically arranged ion emitter blades 360. In an embodiment, each of the vertically arranged ion emitter blades 360 may be in a cylindrical lens shape (e.g., a cylindrical vesica piscis or cylindrical almond shapes) having an outer biconvex surface that come to two sharp edges with a first sharp edge facing inward to the ion emitter 358 and a second sharp edge facing outward toward the ion collector 362. As such, each of the vertically arranged ion emitter blades 360 may include a point or surface at which electrons may be stripped from gas molecules present in the atmosphere at or around the emitter blades 360 to create charged ions. In one embodiment, these edges or surfaces may be made to come to a sharp point in order to efficiently facilitate the creation of more charged ions. In an embodiment, the ion emitter 358 and the emitter blades 360 may be made of a refractory metal such as niobium, chromium, molybdenum, tantalum, tungsten, and rhenium among others. In an embodiment, the portions of the ion emitter 358 and emitter blades 360 may be electroplated with a refractory metal such as niobium, chromium, molybdenum, tantalum, tungsten, and rhenium among others with an interior layer of the ion emitter 358 and emitter blades 360 being made of a conductive material such as iron. It is appreciated that the ion emitter 358 and emitter blades 360 may be made of any alloy of metal that includes alloys of those refractory metals described herein. As described herein, a bottom edge of each of the emitter blades 360 are operatively coupled to an ion emitter base ring 374. This ion emitter base ring 374 may be used to electrically couple the emitter blades 360 of the ion emitter 358 to an electrode of the ionic driving circuit 366 such as a positive electrode in some embodiments.

In an embodiment, the ion emitter/collector blower cooling system 354 includes an ion collector 362. The ion collector 362 may include a plurality of collector blades 364. In an embodiment, these collector blades 364 are arranged vertically in an outer ring radially away from the inner ring of vertically arranged ion emitter blades 360 of the ion emitter 358. Each of the vertically arranged ion collector blades 362 are electrically and physically coupled to each other at an ion collector base ring 376 in an embodiment with this ion collector base ring 376 having a diameter larger than the ion emitter base inner ring 374 used to operatively couple the inner ring of vertically arranged ion emitter blades 360 together. In an embodiment, each of the outer ring of ion collector blades 362 may include a surface at which the charged ions generated at the emitter blades 360 are received and deionized.

As described herein, the outer ring may be an ion emitter 358 with the inner ring operating as the ion collector 362. In an embodiment, the placement of the ion emitter 358 on the outer ring is intended as an alternative operational embodiment used to reverse the direction of airflow to draw heated air within the housing of the information handling system out of a center air exhaust formed about the inner ring of ion collector blades of the ion collector 362. Accordingly, a positive electrode of the ionic driving circuit 366 may be operatively coupled to the outer ring ion emitter 358 with a negative electrode operatively coupled to the inner ring ion collector 362. This orientation of the ion emitter 358 (e.g., outer ring) to the ion collector 362 (e.g., inner ring) is intended as a permanent operation embodiment providing for an opposite direction of airflow than that shown in FIG. 3.

During activation of the ion emitter/collector blower cooling system location that 354 that includes the ion emitter 358 and ion collector 362, an airflow 370 is created. In one embodiment shown in FIG. 3, the airflow 370 is created via ions 370 being generated by the emitter blades 360 of the ion emitter 358. In an example where the ion emitter 358 and ion collector 362 are within atmospheric air, any number of types of gas molecules may be subjected to this ionization process. For example, where the gas includes oxygen ($O_2$), the ionization of oxygen may include the stripping a single electron or two electrons from the oxygen molecule. This may lead to a $O^+$ or $O^{2+}$ ion (e.g., cation) being created by the ion emitter 358 via the ionic driving circuit 366 in an embodiment. Other gas molecules within the atmosphere near the ion emitter 358 may similarly be ionized such as nitrogen, carbon dioxide, argon, hydrogen, etc. to create other ions such as $N^{+1}$, $N^{+2}$, $N^{+3}$, $N^{+4}$, $N^{+5}$, $O_3$ (ozone), $H^{+1}$ and the like. It is appreciated that this list of potential ions generated is merely an example list of ions and the present specification contemplates that other ions can be created. As described herein, the ion emitter 358 may be operatively coupled to an electrode (e.g., a positive electrode) of the ionic driving circuit 366 so as to create the ions described herein.

As the ions are created by the ion emitter 358, the ions are repelled away from the ion emitter 358 towards the ion collector 362 as a result of the electric field created between the ion emitter 358 and ion collector 362 due to the voltage difference between them. The ions generated by the ion emitter 358 are also drawn towards the ion collector 362 to be deionized. In the embodiment, shown in FIG. 3 an airflow 370 is created as a result of this movement of the ions. The movement of the charged ions 368 (e.g., dashed arrows)

from the ion emitter 358 to the ion collector 362 creates a shear force on other gas molecules whether ionically charged or not. This shear force drags these other gas molecules from the ion emitter 358 to the ion collector 362 creating the airflow 370 from the ion emitter 358 towards the ion collector 362. This airflow 370 may pass through the outer ring of vertically arranged ion collector blades 364 allowing air to pass out of a housing that houses the ion emitter 358 and ion collector 362 and throughout portions of the housing of the information handling system and out of an exhaust vent in an embodiment. The airflow may drag cool air into the ion emitter/collector blower cooling system as well such as via a top inlet vent in an ion emitter/collector housing. In another embodiment, the ion emitter/collector blower cooling system 354 includes an exhaust vent that is placed next to a side wall of the housing of the information handling system where an exhaust vent has been formed in the housing of the information handling system As described herein, an air inlet/exhaust 372 formed above or below the ion emitter 358 within the ion inner base ring 374 may serve as an inlet or an air exhaust depending on the direction of airflow 370 as described herein. For example, the air inlet/exhaust 372 may serve as an exhaust when the ion collector 362 operates instead as an ion emitter with the ion collector ring 376 being operatively coupled to, for example, the positive electrode of the ionic driving circuit 366. Similar to the ion emitter 358 as described herein, with the ion collector 362 operatively coupled to the positive electrode acts instead as the ion emitter such that ions are created at the ion collector 362 structure and drawn inward towards the ion emitter 358 structure thereby reversing the direction of airflow 370. This allows the ion emitter/collector blower cooling system 354 to pull air into the ion emitter/collector housing (not shown) from within the housing of the information handling system and, eventually, exhaust heated air out of the information handling system via the air inlet/exhaust 372 in an embodiment. In another embodiment, the ion emitter may generate the ions in order to pull air into the ion emitter/collector housing (not shown) from within the housing of the information handling system and out of the information handling system via an exhaust vent formed in a c-cover or d-cover of a base chassis.

The circular shape of the ion emitter 358 and ion collector 362 shown in FIG. 3 allows for the ion emitter/collector blower cooling system 354 to produce an airflow while still reducing the space used by the ion emitter/collector blower cooling system 354 within the chassis of the information handling system. In an embodiment, the aerodynamic shape of the emitter blades 360 and collector blades 364 minimize any airflow impedance thereby increasing the velocity of the airflow 370 as compared to, for example, a fan or another blower. The ion emitter/collector blower cooling system 354 may also have a top or bottom air inlet/exhaust 372 that allows for the airflow to exit the information handling system within the footprint of the ion emitter/collector blower cooling system 354.

Figure 4:
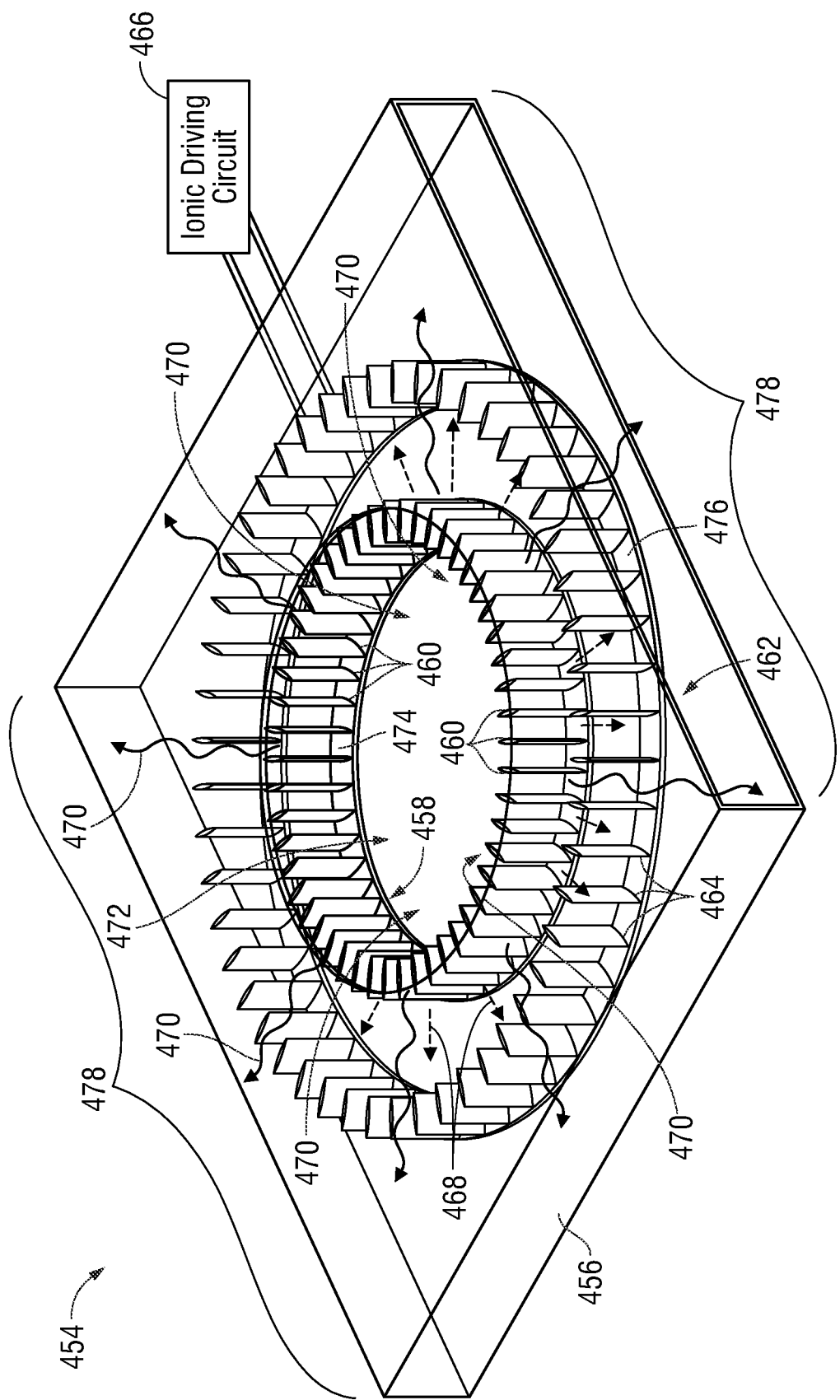
FIG. 4 is a graphic diagram perspective view of the ion emitter blower cooling system within an ion emitter/collector blower housing according to an embodiment of the present disclosure.

FIG. 4 is a graphic diagram perspective view of the ion emitter/collector blower cooling system 454 within an ion emitter/collector housing 456 according to an embodiment of the present disclosure. As described herein, the ion emitter/collector blower cooling system 454 includes an ion emitter 458. The ion emitter 458 may include a plurality of vertically arranged ion emitter blades 460 used, in an embodiment, to create an airflow out of the ion emitter/collector housing 456 into which the ion emitter 458 and ion collector 462 are housed. The number of vertically arranged ion emitter blades 460 may vary depending on an anticipated level of heat generation by the hardware within the information handling system or the shape and design of the ion emitter/collector housing or housing of the information handling system, among other factors.

Each of the vertically arranged ion emitter blades 460 are electrically and physically coupled to each other at an ion emitter base ring 474 in an embodiment. In the embodiment of FIG. 4, the vertically arranged ion emitter blades 460 may be part of an inner ring of vertically arranged ion emitter blades 460. In an embodiment, each of the vertically arranged ion emitter blades 460 may be in a cylindrical lens shape (e.g., a cylindrical vesica piscis or cylindrical almond shapes) having an outer bi-convex surface that come to two sharp edges with a first sharp edge facing inward to the ion emitter 458 and a second sharp edge facing outward toward the ion collector 462. As such, each of the vertically arranged ion emitter blades 460 may include a point or surface at which electrons may be stripped from gas molecules present in the atmosphere at or around the emitter blades 460 to create charged ions 468 (e.g., shown as dashed arrows). In one embodiment, these edges or surfaces may be made to come to a sharp point in order to efficiently facilitate the creation of more charged ions 468. In an embodiment, the ion emitter 458 and the emitter blades 460 may be made of a refractory metal such as niobium, chromium, molybdenum, tantalum, tungsten, and rhenium among others. In an embodiment, the portions of the ion emitter 458 and emitter blades 460 may be electroplated with a refractory metal such as niobium, chromium, molybdenum, tantalum, tungsten, and rhenium among others with an interior layer of the ion emitter 458 and emitter blades 460 being made of a conductive material such as iron. It is appreciated that the ion emitter 458 and emitter blades 460 may be made of any alloy of metal that includes alloys of those refractory metals described herein. As described herein, a bottom edge of each of the emitter blades 460 are operatively coupled to an ion emitter base ring 474. This ion emitter base ring 474 may be used to electrically couple the emitter blades 460 of the ion emitter 458 to an electrode of the ionic driving circuit 466 such as a positive electrode in some embodiments.

In an embodiment, the ion emitter/collector blower cooling system 454 includes an ion collector 462. The ion collector 462 may include a plurality of collector blades 464. In an embodiment, these collector blades 464 are arranged vertically in an outer ring radially away from the inner ring of vertically arranged ion emitter blades 460 of the ion emitter 458. Each of the vertically arranged ion collector blades 462 are electrically and physically coupled to each other at an ion collector base ring 476 in an embodiment with this ion collector base ring 476 having a diameter larger than the ion emitter base ring 474 used to operatively coupled the inner ring of vertically arranged ion emitter blades 460 together. In an embodiment, each of the outer ring of ion collector blades 462 may include a surface at which the charged ions generated at the emitter blades 460 are received and deionized.

During activation of the ion emitter/collector blower cooling system 454 that includes the ion emitter 458 and ion collector 462, an airflow 470 is created. In the embodiment shown in FIG. 4, the airflow 470 is created via ions 468 being generated by the emitter blades 460 of the ion emitter 458. In an example where the ion emitter 458 and ion collector 462 are within atmospheric air, any number of types of gas molecules may be subjected to this ionization process. For example, where the gas includes oxygen ($O_2$), the ionization of oxygen may include the stripping a single electron or two electrons from the oxygen molecule. This may lead to a $O^+$ or $O^{2+}$ ion (e.g., cation) being created by the ion emitter 458 via the ionic driving circuit 466 in an embodiment. Other gas molecules within the atmosphere near the ion emitter 458 may similarly be ionized such as nitrogen, carbon dioxide, argon, hydrogen, etc. to create other ions such as $N^{+1}$, $N^{+2}$, $N^{+3}$, $N^{+4}$, $N^{+5}$, $O_3$ (ozone), $H^{+1}$ and the like. It is appreciated that this list of potential ions generated is merely an example list of ions and the present specification contemplates that other ions can be created. As described herein, the ion emitter 458 may be operatively coupled to an electrode (e.g., a positive electrode) of the ionic driving circuit 466 so as to create the ions described herein.

As the ions 468 are created by the ion emitter 458, the ions are repelled away from the ion emitter 458 at emitter blades 460 towards the ion collector 462 as a result of the electric field created between the ion emitter 458 and ion collector 462 due to the voltage difference between them. The ions 468 generated by the ion emitter 458 are also drawn towards the ion collector 462 to be deionized at ion collector blades 464. In the embodiment shown in FIG. 4, an airflow 470 is created as a result of this movement of the ions 468. The movement of the charged ions 468 from the ion emitter 458 to the ion collector 462 creates a shear force on other gas molecules whether ionically charged or not. This shear force drags these other gas molecules from the ion emitter 458 to the ion collector 462 creating the airflow 470 into the inlet aperture 470, from the ion emitter 458 towards the ion collector 462, and through the ion collector blades 464. In an embodiment, this airflow 470 may pass through the outer ring of vertically arranged ion collector blades 464 allowing air to pass out of a housing that houses the ion emitter 458 and ion collector 462 and throughout portions of the housing of the information handling system and out of an exhaust vent. In another embodiment, the ion emitter/collector housing 456 of the ion emitter/collector blower cooling system 454 includes one or more exhaust vents 478 that are placed next to a side wall of the housing of the information handling system where an external exhaust vent has been formed in the housing of the information handling system. Although FIG. 4 shows two exhaust vents 478, it is appreciated that more than two exhaust vents 478 may be formed into the ion emitter/collector housing 456 for the airflow 470 to pass through.

As described in various embodiments herein, the air inlet aperture 472 formed above the ion emitter 458 may serve as an inlet or an air exhaust depending on the direction of airflow 470. For example, the air inlet aperture 472 may serve as an exhaust when the ion collector 462 operates as an ion emitter with the ion collector 462 structure being operatively coupled to, for example, the positive electrode of the ionic driving circuit 466. Similar to the operation of the ion emitter 458 as described herein, with the ion collector 462 operatively coupled to the positive electrode ions are created at the ion collector 462 structure and drawn towards the ion emitter 458 structure thereby reversing the direction of airflow 470. This allows the ion emitter/collector blower cooling system 454 to pull air into the ion emitter/collector housing 456 via the exhaust vent 478 from within the housing of the information handling system and, eventually, exhaust heated air out of the information handling system via air inlet aperture 472 in an embodiment. In another embodiment, the ion emitter 458 may generate the ions 468 in order to pull air into the ion emitter/collector housing (not shown) from within the housing of the information handling system and out of the information handling system via the inlet aperture vent 472 formed in a c-cover or d-cover of the information handling chassis.

The shape of the ion emitter/collector housing 456 shown in FIG. 4 is square. In an embodiment, internal walls within the ion emitter/collector housing 456 may direct the airflow 470 passing through the collector blades 464 towards an exhaust vent 478 or a plurality of exhaust vents 478. In an embodiment, the internal walls within the ion emitter/collector housing 456 may serve to allow the airflow 470 to pass through the ion emitter/collector housing 456 with little impedance so that the velocity of the airflow 470 is not reduced.

The circular shape of the ion emitter 458 and ion collector 462 shown in FIG. 4 allows for the ion emitter/collector blower cooling system 454 to produce an airflow while occupying minimal space used by the ion emitter/collector blower cooling system 454 within the housing of the information handling system. In an embodiment, the shape of the ion emitter 458 and ion collector 462 need not be circular in other embodiments. Other shapes of the ion emitter 458 and ion collector 462 may include oval, polygonal, irregular, or other shapes to account for the information handling system chassis in which it may be used in various embodiments. In an embodiment, the aerodynamic shape of the emitter blades 460 and collector blades 464 minimize any airflow impedance thereby increasing the velocity of the airflow 470 as compared to, for example, a fan or another blower. The ion emitter/collector blower cooling system 454 may also have a top or bottom air inlet or outlet aperture 472 that allows for the airflow to exit the information handling system within the footprint of the ion emitter/collector blower cooling system 454.

Figure 5:
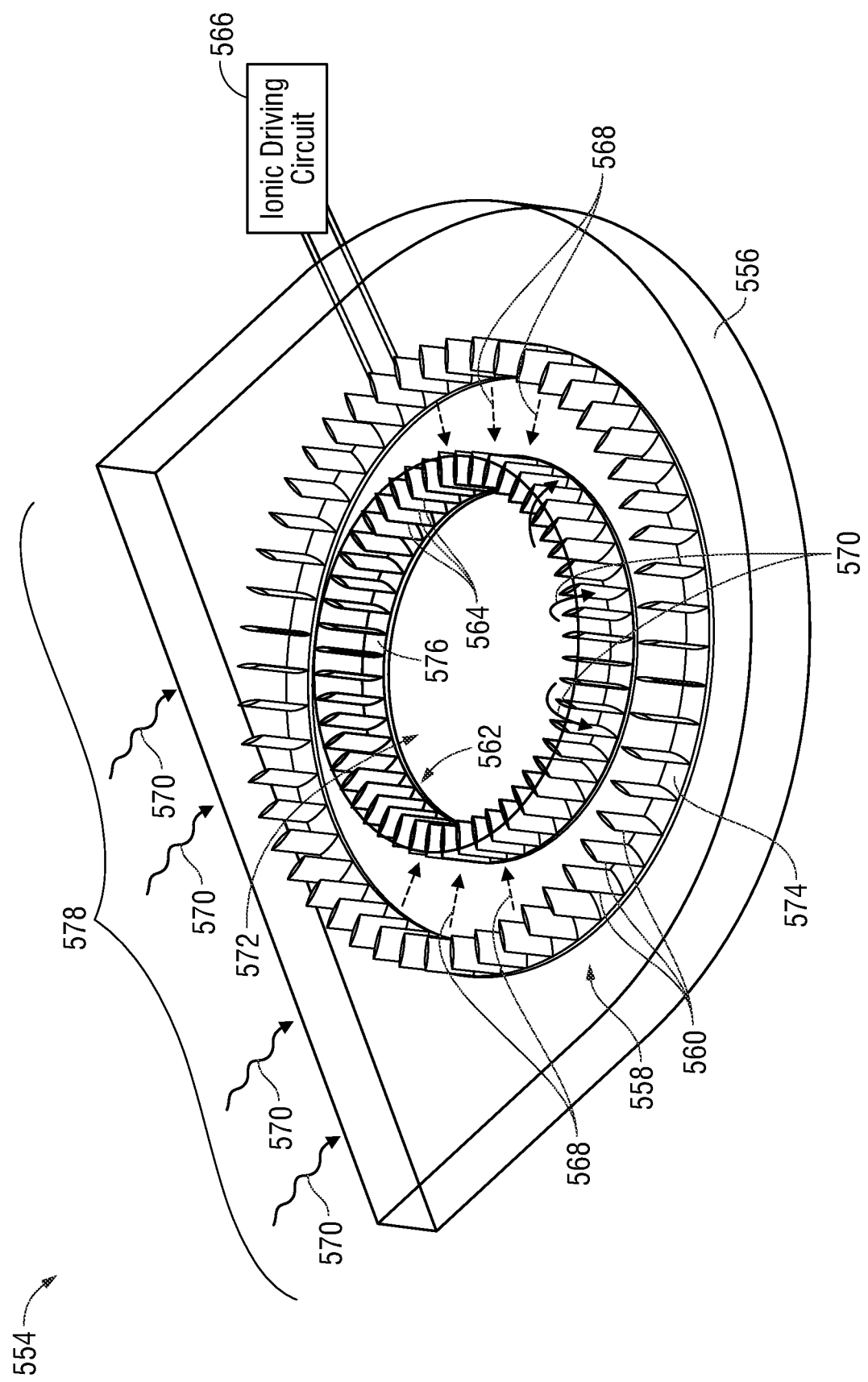
FIG. 5 is a graphic diagram perspective view of the ion emitter blower cooling system within an ion emitter/collector blower housing according to another embodiment of the present disclosure.

FIG. 5 is a graphic diagram perspective view of the ion emitter blower cooling system 554 within an ion emitter/collector blower housing 556 according to another embodiment of the present disclosure. The ion emitter/collector housing 556 shown in FIG. 5 is different in shape and configuration from the housing 456 of FIG. 4. It is understood that the ion emitter/collector housing 456 shown in FIG. 4 or the ion emitter/collector housing 556 of FIG. 5 or others may be used with the emitter and collector arrangements of embodiments herein. As described herein, the ion emitter/collector blower cooling system 554 includes an ion emitter 558. The ion emitter 558 may include a plurality of vertically arranged ion emitter blades 560 used, in an embodiment, to create an airflow out of the ion emitter/collector housing 556 into which the ion emitter 558 and ion collector 562 are housed. The number of vertically arranged ion emitter blades 560 may vary depending on an anticipated level of heat generation by the hardware within the information handling system or the shape and design of the ion emitter/collector housing 556 or chassis of the information handling system, among other factors.

Each of the vertically arranged ion emitter blades 560 are electrically and physically coupled to each other at an ion emitter base ring 574 in an embodiment. In an embodiment, the vertically arranged ion emitter blades 560 may be part of an outer ring of vertically arranged ion emitter blades 560 in contrast to the ion emitter blade (e.g., 460, FIG. 4) as shown and described in FIG. 4. In an embodiment, each of the vertically arranged ion emitter blades 560 may be in a cylindrical lens shape (e.g., a cylindrical vesica piscis or cylindrical almond shapes) having an outer bi-convex surface that come to two sharp edges with a first sharp edge facing inward to the ion emitter 558 and a second sharp edge facing outward toward the ion collector 562. As such, each of the vertically arranged ion emitter blades 560 may include a point or surface at which electrons may be stripped from gas molecules present in the atmosphere at or around the emitter blades 560 to create charged ions 568 (e.g., shown as dashed arrows). In one embodiment, these edges or surfaces may be made to come to a sharp point in order to efficiently facilitate the creation of more charged ions 568. In an embodiment, the ion emitter 558 and the emitter blades 560 may be made of a refractory metal such as niobium, chromium, molybdenum, tantalum, tungsten, and rhenium among others. In an embodiment, the portions of the ion emitter 558 and emitter blades 560 may be electroplated with a refractory metal such as niobium, chromium, molybdenum, tantalum, tungsten, and rhenium among others with an interior layer of the ion emitter 558 and emitter blades 560 being made of a conductive material such as iron. It is appreciated that the ion emitter 558 and emitter blades 560 may be made of any alloy of metal that includes alloys of those refractory metals described herein. As described herein, a bottom edge of each of the emitter blades 560 are operatively coupled to an ion emitter base ring 574. This ion emitter base ring 574 may be used to electrically couple the emitter blades 560 of the ion emitter 558 to an electrode of the ionic driving circuit 566 such as a positive electrode in some embodiments.

In an embodiment, the ion emitter/collector blower cooling system 554 includes an ion collector 562. The ion collector 562 may include a plurality of collector blades 564. In an embodiment, these collector blades 564 are arranged vertically in an inner ring placed within the outer ring of vertically arranged ion emitter blades 560 of the ion emitter 558. Each of the vertically arranged ion collector blades 564 are electrically and physically coupled to each other at an ion collector base ring 576 in an embodiment with this ion collector base ring 576 having a diameter smaller than the ion emitter base ring 574 used to operatively coupled the outer ring of vertically arranged ion emitter blades 560 together. In an embodiment, each of the inner ring of ion collector blades 562 may include a surface at which the charged ions generated at the emitter blades 560 are received and deionized.

As described herein, the ion emitter 558 may be operatively coupled to a positive electrode of a high voltage source of the ionic driving circuit 566. This allows the ion emitter 558 to strip electrons from various molecules creating, in an example embodiment, positively-charged ions. The operative and electrical coupling of the positive electrode to the ion emitter 558 may, in an embodiment, allow for the airflow 570 to pass into an inlet vent 578 formed in a sidewall of the ion emitter/collector housing 556 and out of the air exhaust top or bottom aperture 572 serving as an air exhaust in FIG. 5. The direction of the airflow 570 shown in FIG. 5 may be the example of normal operation of the ion emitter/collector blower cooling system 554 of an embodiment of FIG. 5 such that heated air is received at the inlet vent 578 and exhausted out of the air exhaust top or bottom aperture 572. However, as described herein, the direction of the airflow 570 may be selectively switched by switching the positive and negative electrodes of the ionic driving circuit 566 to the ion collector 562 and ion emitter 558. In this example, the positive electrode may be operatively coupled to the ion collector 562 structure while the negative electrode is operatively coupled to the ion emitter 558 structure. This reverses the airflow due to the ion collector 562 structure now operating as an ion emitter that generates ions and the ion emitter 558 structure operating as an ion collector that attracts and deionizes the ions 568. This reversal of the operations of the ion emitter 558 and ion collector 562 may be conducted by the ionic driving circuit 566 in the embodiments herein and may be initiated in order to conduct a cleaning process used to dislodge any dust or other particles that have accumulated on the hardware within the ion emitter/collector housing 556 and the housing of the information handling system. After this cleaning process, the ionic driving circuit 566 may again reverse the coupling of the electrodes so that the ion emitter 558 may operate as an ion emitter and the ion collector 562 may operate as an ion collector and producing the direction of airflow 570 as shown in FIG. 5.

As described herein and shown in FIG. 5, the airflow 570 is created via ions 570 being generated by the emitter blades 560 of the ion emitter 558. In an example where the ion emitter 558 and ion collector 562 are within atmospheric air, any number of types of gas molecules may be subjected to this ionization process. For example, where the gas includes oxygen ($O_2$), the ionization of oxygen may include the stripping a single electron or two electrons from the oxygen molecule. This may lead to a $O^+$ or $O^{2+}$ ion (e.g., cation) being created by the ion emitter 558 via the ionic driving circuit 566 in an embodiment. Other gas molecules within the atmosphere near the ion emitter 558 may similarly be ionized such as nitrogen, carbon dioxide, argon, hydrogen, etc. to create other ions such as $N^{+1}$, $N^{+2}$, $N^{+3}$, $N^{+4}$, $N^{+5}$, $O_3$ (ozone), $H^{+1}$ and the like. It is appreciated that this list of potential ions generated is merely an example list of ions 568 and the present specification contemplates that other ions can be created. As described herein, the ion emitter 558 may be operatively coupled to an electrode (e.g., a positive electrode) of the ionic driving circuit 566 so as to create the ions described herein.

As the ions 568 are created by the ion emitter 558, the ions are repelled away from the ion emitter 558 towards the ion collector 562 as a result of the electric field created between the ion emitter 558 and ion collector 562 due to the voltage difference between them. The ions 568 generated by the ion emitter 558 are also drawn towards the ion collector 562 to be deionized. In the embodiment, shown in FIG. 5 an airflow 570 is created as a result of this movement of the ions 568. The movement of the charged ions 568 from the ion emitter 558 to the ion collector 562 creates a shear force on other gas molecules whether ionically charged or not. This shear force drags these other gas molecules from the ion emitter 558 to the ion collector 562 creating the airflow 570 into inlet vent 578, from the ion emitter 558 towards the ion collector 562 and through ion collector blades 564. In an embodiment, this airflow 570 may pass through the inner ring of vertically arranged ion collector blades 564 allowing air to pass out of the ion emitter/collector housing 556 that houses the ion emitter 558 and ion collector 562 and throughout portions of the chassis of the information handling system or out of an exhaust vent of the c-cover or d-cover of the information handling system chassis aligned with the exhaust top or bottom aperture 572.

The shape of the ion emitter/collector housing 556 shown in FIG. 5 includes a contouring edge the follows the contour of the ring of emitter blades 560 of the ion emitter 558. Another side of the ion emitter/collector housing 556, in an embodiment, may include a flat edge into which the inlet vent 578 is formed. In an embodiment, internal walls within the ion emitter/collector housing 556 may direct the airflow 570 passing through the emitter blades 560 towards an air exhaust top or bottom aperture 572. In an embodiment, the internal walls within the ion emitter/collector housing 556 may serve to allow the airflow 570 to pass through the ion emitter/collector housing 556 with little impedance so that the velocity of the airflow 570 is not reduced. It is understood any shape or configuration of ion emitter/collector housing 556 may be used to accommodate the chassis of an information handling system in various embodiments.

The circular shape of the ion emitter 558 and ion collector 562 shown in FIG. 5 allows for the ion emitter/collector blower cooling system 554 to produce an airflow while still minimizing the space used by the ion emitter/collector blower cooling system 554 within the housing of the information handling system. In an embodiment, the shape of the ion emitter 558 and ion collector 562 need not be circular in other embodiments. Other shapes of the ion emitter 558 and ion collector 562 may include oval, polygonal, irregular, or other shapes to account for the information handling system chassis in which it may be used in various embodiments. In an embodiment, the aerodynamic shape of the emitter blades 560 and collector blades 564 minimize any airflow impedance thereby increasing the velocity of the airflow 570 as compared to, for example, a fan or blower.

Figure 6:
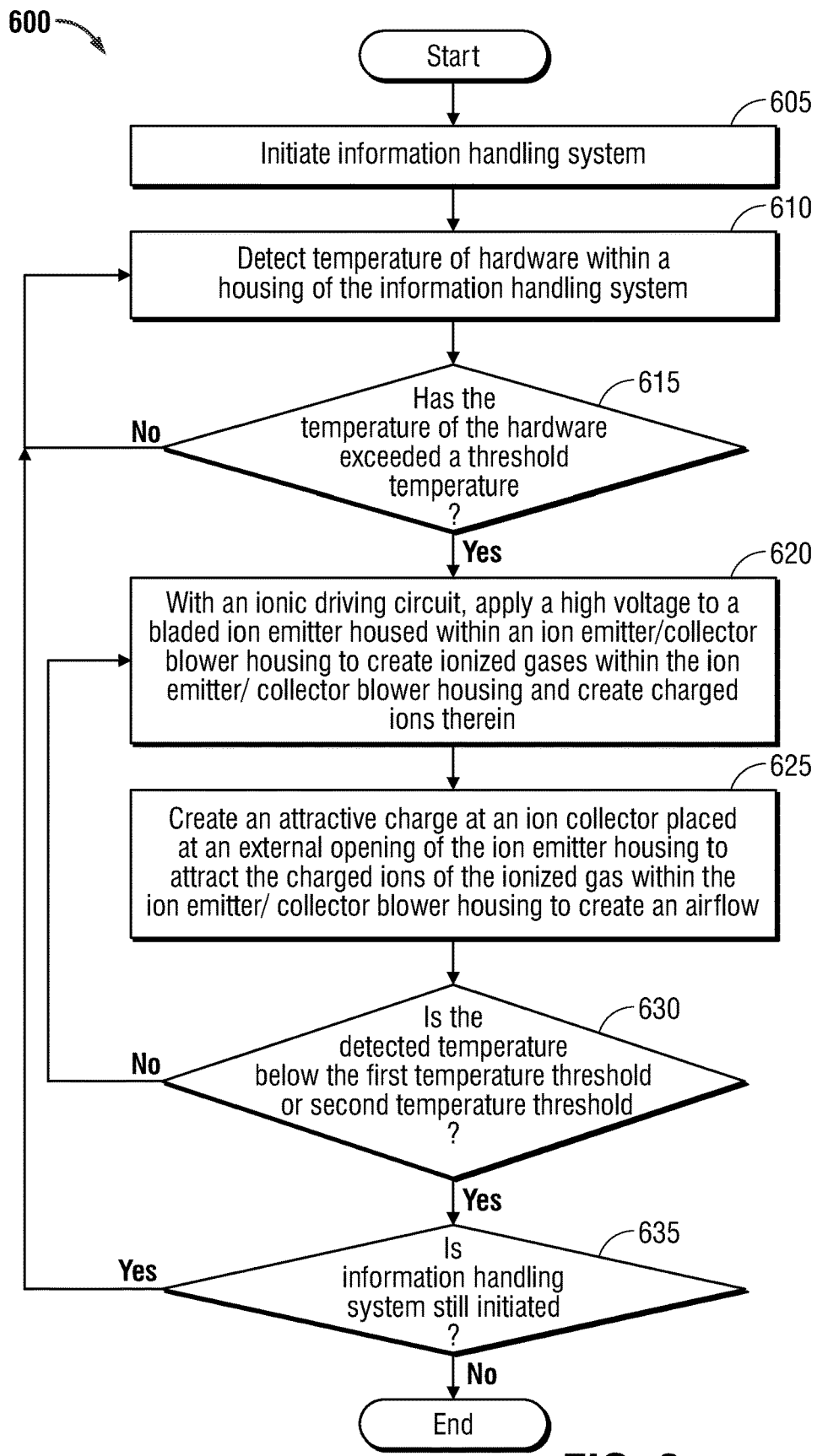
FIG. 6 is a flow diagram of a method of operating an ion emitter/collector blower cooling system of an information handling system according to an embodiment of the present disclosure.

FIG. 6 is a flow diagram of a method of operating an ion emitter/collector blower cooling system of an information handling system according to an embodiment of the present disclosure. The ion emitter/collector blower cooling system described herein may operate with other cooling systems (either passive or active) placed within a housing of the information handling system such as a heat pipe, a set of thermal fins, and/or a vapor tube, among other types of cooling systems. In an embodiment, these passive cooling systems may be operatively and thermally coupled to the ion emitter, ion collector, or both so that heat conducted into the emitter blades or collector blades may be dissipated into the airflow created via operation of the ion emitter and ion collector as described herein.

The method 600 includes, at block 605 with initiating the information handling system. This initiation process may be conducted by the user actuating, for example, a power key on the information handling system. The actuation of this power key may cause the execution of a native BIOS, a native OS, or other machine-readable code instructions used and executed by the processor of the information handling system to operate the hardware within the information handling system including the disclosed ion emitter/collector blower cooling system described herein. In an embodiment, the initiation of the information handling system may further include an initiation of a hardware controller, a PMU controller, or hardware processor to execute machine-readable code instructions of an ion emitter control system to control an ionic driving circuit for the disclosed ion emitter/collector blower cooling system described herein.

At block 610, the temperature of the hardware within the housing of the information handling system may be detected. In an embodiment, the temperature of the hardware that is detected may be detected using a temperature sensor coupled to one or more hardware devices such as the hardware processor, PMU controller, or other hardware processing resource, battery, or video display device, for example, of the information handling system among other hardware components. Other example embodiments may include a processing management system that measures the processing resources consumed by any type of processing device and calculates an interior temperature of the housing of the information handling system. The temperature sensor, such as a thermistor, may report a temperature of the information handling system (e.g., a specific hardware device or a temperature in a housing of the information handling system) to the ion emitter/collector blower cooling system in an embodiment.

At block 615, the method 600 may include determining if the temperature of the hardware components has exceeded a threshold temperature using the ion emitter control system. The activation of any other active cooling systems within the housing of the information as well as the ion emitter/collector blower cooling system described herein with the ion emitter and ion collector may depend on whether a threshold temperature has been reached. In another example embodiment, the process of determining if the threshold temperature has been achieved may determine whether to increase or decrease voltage difference applied between the ion emitter and ion collector that may increase and decrease the generation of ions used to create, respectively, stronger, or weaker airflow. Where the threshold temperature has not been reached at block 615, the method 600 may continue to block 610 again to detect the temperature of the hardware within the housing of the information handling system.

In an embodiment, the activation of the ionic driving circuit to create ions at the ion emitter is activated when a first temperature threshold is reached as determined at block 615. Where that first temperature threshold is not reached the ion emitter/collector blower cooling system is not activated and the operation of the information handling system continues, in an embodiment, without the cooling of the hardware within the information handling system. This may be done so as to reduce the power consumption by the ion emitter/collector blower cooling system when its operation is not necessary to reduce the temperature of these heat-generating hardware components within the housing of the information handling system.

Where the first temperature threshold is reached (e.g., 40° C.), the activation of the ionic driving circuit causes the charged ions to be created at the ion emitter, in example embodiments (e.g., FIGS. 3 and 4). Migration of these ions along an electric field between the ion emitter blades and ion collector blades causes the creation of airflow between the ion emitter and ion collector via the shear forces of the ions moving surrounding air as described in embodiments herein. In an embodiment, at block 615, a second temperature threshold may also be detected. This second threshold temperature may be set to a temperature higher than the temperature of the first temperature threshold. Where this second temperature threshold (e.g., 45° C.) is reached, the ion emitter/collector blower cooling system may be used to increase the voltage difference applied between the ion emitter and ion collector. In other embodiments, the second temperature threshold may determine an activation of other active cooling systems in an information handling system such as a fan within the information handling system, but activation of such a fan (thereby creating noise) may be postponed by the use of the relatively quieter ion emitter/collector blower cooling system of embodiments of the present disclosure. Additional temperature thresholds may also be monitored by the ion emitter/collector blower cooling system (e.g., temperatures above those temperatures associated with the first and second temperature thresholds) that cause the voltage difference between the ion emitter and ion collector to be increased in order to create a stronger airflow through the ion emitter/collector housing via the creation of more ions. It is appreciated, in some embodiments, that the activation of the ionic driving circuit to create charged ions at the ion emitter (or ion collector operating as an ion emitter in some embodiments) may be completed when the second temperature threshold is reached while the increase in voltage difference is initiated when the first temperature threshold is reached in another embodiment. The selective activation of the ionic driving circuit to create charged ions at the ion emitter (or ion collector operating as an ion emitter in some embodiments) at the first temperature threshold and the increase in voltage difference or for activation of other active cooling systems such as a fan allows for a two-stepped or multi-step cooling process. This two-stepped or multi-step cooling process with the disclosed ion emitter/collector cooling system provides for at least silent cooling of the hardware within the housing of the information handling system to be extended in some embodiments.

Where a threshold temperature (e.g., first temperature threshold or second threshold) has been reached at block 615, the method 600 may continue to block 620 with causing a high voltage source of the ionic driving circuit to apply a high voltage to an ion emitter of the ion emitter/collector blower cooling system to create ionized gases thereby creating charged ions between the ion emitter and ion collector. In an embodiment, the ionic driving circuit is controlled via the hardware processor of the information handling system, a controller associated with the PMU of the information handling system, other hardware processing resources, or a combination thereof executing firmware or software of the ion emitter/collector blower cooling system. The ionic driving circuit, in an embodiment, includes a high voltage source that is operatively coupled to the ion emitter and ion collector depending on the operation of each of these devices as described herein. The high voltage source of the ionic driving circuit causes, in an embodiment, the ion emitter to generate and repel ions from the edges, points, or other surfaces formed on the emitter blades of the ion emitter. In the context of the present specification, the term "emit" or "emitter" is meant to describe an action and device that, at its edges, creates/generates ions and, via an electromagnetic repulsion, repels those ions towards an oppositely charged source such as the ion collector ring described herein. In an embodiment, the vertically arranged ion emitter blades may be part of an inner ring of vertically arranged ion emitter blades that form the ion emitter. In this embodiment, collector blades of an ion collector may be arranged vertically in an outer ring radially away from the inner ring of vertically arranged ion emitter blades of the ion emitter. In an alternative embodiment, the vertically arranged ion emitter blades may be part of an outer ring of vertically arranged ion emitter blades. In this alternative embodiment, vertically arranged ion collector blades may be part of an inner ring. In an embodiment, the high voltage source of the ionic driving circuit causes electrons to be stripped from gas molecules near the enclosed ion emitter cooling system causing those gases to be ionized. This ionization process may include the removal of one or more electrons to the outer valence shells of the individual molecules within the gas such that they become positively charged (e.g., cation). In an example where the space between the ion emitter and ion collector includes atmospheric air, any number of types of gas molecules may be subjected to this process. For example, where the gas includes oxygen (O), the ionization of oxygen may include the removal of a single electron or two electrons to the outermost valence electron shell. This may lead to a $O^+$ or $O^{2+}$ ion (e.g., cations) being created by the ion emitter/collector blower cooling system and ionic driving circuit in an embodiment. Other gas molecules within the atmosphere within the ion emitter/collector blower housing may similarly be ionized and the present specification contemplates the ionization of these other gas molecules in order to create the airflow described herein.

In an embodiment, the movement of the ions created and emitted from the ion emitter may be from the ion emitter to the ion collector at block 625 of the method 600. In an embodiment, an attractive charge, for example, at an ion collector is used to attract the charged ions of the ionized gas near the ion collector to create an airflow at block 525. In an example embodiment, the ion emitter may be operatively coupled to a positive electrode of the high voltage source of the ionic driving circuit. As a result of creating the positively-charged ions, the ion emitter now repels those positively-charged ions. Additionally, in an embodiment, the ion collector is operatively coupled to the negative electrode of the high voltage source of the ionic driving circuit. This causes the positively-charged ions created by the ion emitter to be attracted to the ion collector further causing movement of the ions and creating an airflow through the ion emitter/collector blower cooling system. As the positively-charged ions reach the ion collector, those valence electrons removed from the ions by the ion emitter may be replaced thereby placing those gases at a neutral electrical charge again. Following the example of the ionization of the oxygen atoms in the atmospheric gases within near the ion emitter by the ion emitter, as these $O^+$ or $O^{2+}$ ions have their valence electron shells (e.g., a single electron or two electrons, respectively) replenished, they are placed in the electrically neutral state.

Again, as described herein, the ion collector, instead of operating as an ion collector as shown in FIGS. 3 and 4, may be switched to operate as an ion emitter to generate those ions with the ion emitter now, in an embodiment, operating as an ion collector. As described herein, this allows the ion emitter/collector blower cooling system to create an airflow in either of two opposite directions as shown in FIGS. 3, 4, and 5. The ion emitter/collector blower cooling system of embodiments herein can be orientated and disposed in a variety of ways with different inlet vents and exhaust vents for a base chassis of an information handling system. In an example embodiment, the ion collector may be operatively coupled to a positive electrode of the high voltage source of the ionic driving circuit. As a result of creating the positively-charged ions, the ion collector now repels those positively-charged ions. Additionally, in an embodiment, the ion emitter is operatively coupled to the negative electrode of the high voltage source of the ionic driving circuit. This causes the positively-charged ions created by the ion collector to be attracted to the ion emitter further causing movement of the ions and creating an airflow through the ion emitter/collector blower cooling system. As the positively-charged ions reach the ion emitter, those valence electrons removed from the ions by the ion collector may be replaced thereby placing those gases at a neutral electrical charge again. The switching of the electrodes operatively coupled to the ion emitter and ion collector may allow for a temporary change in the direction of airflow through the ion emitter/collector housing so as to conduct a cleaning process that may dislodge accumulated dust or other contaminates from the ion emitter/collector blower cooling system or other hardware components within the housing of the information handling system.

The method 600 further includes, at block 630, determining whether the detected temperature is now below a temperature threshold such as the first and/or second temperature thresholds as described herein. Where the detected temperature is not below either or both temperature thresholds, the method 600 may return to block 620 with operating the ion emitter and ion collector as described herein in order to create the airflow through the ion emitter/collector housing. Where the detected temperature at block 630 has fallen below one or both of the first temperature threshold and second temperature threshold, the method 600 may continue to block 635.

At block 635, the method 600 includes determining whether the information handling system is still initiated. Where the information handling system is no longer initiated (e.g., power has been removed from the information handling system via actuation of a power button), the method 600 may end here. Where the information handling system is still initiated, the method 600 may continue to block 610 with continuing to detect the temperature or one or more hardware components with the housing of the information handling system as described herein.

The blocks of the flow diagrams of FIG. 6 or steps and aspects of the operation of the embodiments herein and discussed above need not be performed in any given or specified order. It is contemplated that additional blocks, steps, or functions may be added, some blocks, steps or functions may not be performed, blocks, steps, or functions may occur contemporaneously, and blocks, steps, or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system comprising:
a processor;
a memory device;
a power management unit (PMU) to provide power to the processor and memory device;
an ion emitter/collector blower cooling system including:
an ion emitter including an inner ring of vertically arranged ion emitter blades; and
an ion collector including an outer ring of vertically arranged ion collector blades; and
an ionic driving circuit operatively coupled to the ion emitter to couple a first voltage to the inner ring of vertically arranged ion collector blades to ionize gases at the ion emitter to create charged ions; and
the ionic driving circuit operatively coupled to the ion collector to apply a second voltage to attract the charged ions from the ion emitter to create an airflow from the ion emitter to the ion collector, the airflow passing through the outer ring of vertically arranged ion collector blades and out of an external opening of an ion emitter/collector housing of the ion emitter/collector blower cooling system.

2. The information handling system of claim 1 further comprising:
the ion collector to provide a deionization source for the ionized gases formed at the vertically arranged ion emitter blades, the ion collector operatively coupled to the ionic driving circuit to create an attractive force via a second voltage at the ion collector to attract the ionized gas.

3. The information handling system of claim 2, wherein the outer ring of vertically arranged ion collector blades of the ion collector operate as thermal fins to dissipate heat from the information handling system via the airflow created by the attractive movement of the ionized gas to the ion collector.

4. The information handling system of claim 1 further comprising:
the ionic driving circuit including a high-voltage electrical source to create excitation of electrons via the first voltage at blade edges of the plurality of emitter blades.

5. The information handling system of claim 1 further comprising:
a center air inlet formed in the ion emitter/collector housing above the inner ring of vertically arranged ion emitter blades to draw air into the ion emitter/collector housing of the ion emitter/collector blower cooling system.

6. The information handling system of claim 1, wherein blade edges of the inner ring of vertically arranged ion emitter blades are sharpened edges that function as electron stripping locations where the charged ions are generated.

7. The information handling system of claim 1 further comprising:
the inner ring of vertically arranged ion emitter blades being arranged generally parallel to the airflow created by the movement of the charged ions from the inner ring of vertically arranged ion emitter blades to the outer ring of vertically arranged ion collector blades.

8. The information handling system of claim 1 further comprising:
the outer ring of vertically arranged ion collector blades being arranged generally parallel to the airflow created by the movement of the charged ions from the inner ring of vertically arranged ion emitter blades to the outer ring of vertically arranged ion collector blades.

9. An ion emitter/collector blower cooling system for an information handling system comprising:
an ion emitter/collector housing;
an ion emitter/collector blower cooling system including:
an ion emitter including an outer ring of vertically arranged ion emitter blades; and
an ion collector including an inner ring of vertically arranged ion collector blades; and
an ionic driving circuit operatively coupled to the ion emitter to couple a first voltage to the outer ring of vertically arranged ion emitter blades to ionize gases at the ion emitter to create charged ions;

the ion emitter outer ring of vertically arranged ion emitter blades to repel the charged ions to create an airflow from the ion emitter to the inner ring of vertically arranged ion collector blades and out of a central outlet opening of the ion emitter/collector housing of the ion emitter/collector blower cooling system.

10. The ion emitter/collector blower cooling system of claim 9 further comprising:
the ion collector to provide a deionization source for the ionized gases formed at the inner ring of vertically arranged ion emitter blades, the ion collector operatively coupled to the ionic driving circuit to create an attractive force via a second voltage at the ion collector to attract the ionized gas.

11. The ion emitter/collector blower cooling system of claim 10, wherein the outer ring of vertically arranged ion emitter blades of the ion emitter operate as thermal fins to dissipate heat from the information handling system via the airflow created by the attractive movement of the ionized gas to the ion collector.

12. The ion emitter/collector blower cooling system of claim 9 further comprising:
the ionic driving circuit including a high-voltage electrical source to create excitation of electrons via the first voltage at blade edges of the plurality of vertically arranged ion emitter blades.

13. The ion emitter/collector blower cooling system of claim 9 further comprising:
a center air outlet formed above the inner ring of vertically arranged ion collector blades to expel air from the housing of the ion emitter/collector blower cooling system.

14. The ion emitter/collector blower cooling system of claim 9, wherein blade edges of the outer ring of vertically arranged ion emitter blades are sharpened edges that function as electron stripping locations where the charged ions are generated.

15. The ion emitter/collector blower cooling system of claim 9 further comprising:
the inner ring of vertically arranged ion collector blades being arranged generally parallel to the airflow created by the movement of the charged ions from the outer ring of vertically arranged ion emitter blades to the inner ring of vertically arranged ion collector blades.

16. The ion emitter/collector blower cooling system of claim 9 further comprising:
the outer ring of vertically arranged ion emitter blades being arranged generally parallel to the airflow created by the movement of the charged ions from the outer ring of vertically arranged ion emitter blades to the inner ring of vertically arranged ion collector blades.

17. A method of operating an ion emitter/collector blower cooling system of an information handling system comprising:
with an ionic driving circuit, applying a first voltage to an inner ring of vertically arranged ion emitter blades of an ion emitter housed within an ion emitter/collector housing of the ion emitter/collector blower cooling system to create ionized gases within the ion emitter/collector housing and create charged ions therein; and
with the ionic driving circuit operatively coupled to an ion collector, applying a second voltage to the ion collector to create an airflow to the ion collector and out of an external opening of the housing and draw air in an air inlet in the ion emitter/collector housing.

18. The method of claim 1, wherein the inner ring of vertically arranged ion emitter blades are arranged generally parallel to the airflow created by the movement of the charged ions from the inner ring of vertically arranged ion emitter blades to the outer ring of vertically arranged ion collector blades.

19. The method of claim 17 wherein the outer ring of vertically arranged ion collector blades are arranged generally parallel to the airflow created by the movement of the charged ions from the inner ring of vertically arranged ion emitter blades to the outer ring of vertically arranged ion collector blades.

20. The method of claim 17 further comprising:
operatively and thermally coupling a passive cooling device to the outer ring of vertically arranged ion collector blades to dissipate heat into the outer ring of vertically arranged ion collector blades as airflow passes between the outer ring of vertically arranged ion collector blades.

* * * * *